(12) United States Patent
Bae et al.

(10) Patent No.: US 12,171,133 B2
(45) Date of Patent: Dec. 17, 2024

(54) DISPLAY DEVICE WITH SUB-PIXELS AND SENSING ELEMENTS

(71) Applicant: SAMSUNG DISPLAY CO., LTD., Yongin-si (KR)

(72) Inventors: Kwang Soo Bae, Yongin-si (KR); Gee-Bum Kim, Yongin-si (KR); Bokwang Song, Yongin-si (KR); Min Oh Choi, Yongin-si (KR)

(73) Assignee: SAMSUNG DISPLAY CO., LTD, Yongin-si (KR)

( * ) Notice: Subject to any disclaimer, the term of this patent is extended or adjusted under 35 U.S.C. 154(b) by 0 days.

(21) Appl. No.: 18/462,976

(22) Filed: Sep. 7, 2023

(65) Prior Publication Data

US 2024/0122030 A1 Apr. 11, 2024

(30) Foreign Application Priority Data

Oct. 11, 2022 (KR) .................. 10-2022-0130027

(51) Int. Cl.
*G06V 40/13* (2022.01)
*H10K 59/35* (2023.01)
*H10K 59/40* (2023.01)
*H10K 59/65* (2023.01)

(52) U.S. Cl.
CPC ......... *H10K 59/65* (2023.02); *G06V 40/1318* (2022.01); *H10K 59/353* (2023.02); *H10K 59/40* (2023.02)

(58) Field of Classification Search
CPC ...... H10K 59/65; H10K 59/353; H10K 59/40; G06V 40/1318
See application file for complete search history.

(56) References Cited

U.S. PATENT DOCUMENTS

| 8,492,728 | B2 | 7/2013 | Antonuk |
| 10,763,315 | B2 | 9/2020 | Bang et al. |
| 2020/0105841 | A1* | 4/2020 | Bang ...................... H10K 59/60 |
| 2021/0200366 | A1 | 7/2021 | Bok et al. |

FOREIGN PATENT DOCUMENTS

| KR | 10-2020-0037653 | 4/2020 |
| KR | 10-2021-0086907 | 7/2021 |

* cited by examiner

*Primary Examiner* — Jonathan A Boyd
(74) *Attorney, Agent, or Firm* — F. Chau & Associates, LLC

(57) ABSTRACT

A display device includes a base layer, and a pixel layer disposed on the base layer. The pixel layer includes reference pixel units and photo-sensing elements. Each of the reference pixel units includes a first light-emitting element, a second light-emitting element, and a third light-emitting element. Each of the photo-sensing elements is interposed between two second light-emitting elements adjacent to each other in a first direction, and at least one of the first light-emitting element or the third light-emitting element includes a plurality of sub-light-emitting elements electrically connected to each other.

20 Claims, 17 Drawing Sheets

DISPLAY DEVICE WITH SUB-PIXELS AND SENSING ELEMENTS

CROSS-REFERENCE

This application claims priority under 35 U.S.C. § 119 to Korean Patent Application No. 10-2022-0130027 filed on Oct. 11, 2022, in the Korean Intellectual Property Office, the disclosure of which is incorporated by reference herein in its entirety.

FIELD

The present disclosure generally relates to display devices. More particularly, the present disclosure relates to display devices for recognizing biometric information.

Discussion

A display device displays an image to provide information to a user or provides various functions, such as a function for sensing an input of a user for systematic communications with the user. Display devices may have functions for sensing biometric information of the user.

For example, a manner of recognizing biometric information may include a capacitive manner of sensing a change in capacitance formed between electrodes, an optical manner of sensing an incident light by using a light sensor, and/or an ultrasonic manner of sensing vibration by utilizing a piezoelectric body.

SUMMARY

Embodiments of the present disclosure may provide for display devices having sensing performance optimized to recognize biometric information.

According to an embodiment, a display device comprises: a base layer; and a pixel layer disposed on the base layer and including a plurality of reference pixel units and a plurality of photo-sensing elements, wherein each of the plurality of reference pixel units includes: a first light-emitting element, a second light-emitting element, and a third light-emitting element, wherein each of the plurality of photo-sensing elements is interposed between two second light-emitting elements adjacent to each other in a first direction, and wherein at least one of the first light-emitting element or the third light-emitting element includes a plurality of sub-light-emitting elements electrically connected to each other.

In a display device embodiment, the third light-emitting element may include: a plurality of third sub-light-emitting elements arranged in the first direction. In an embodiment, the plurality of third sub-light-emitting elements may have substantially the same shape and size.

In a display device embodiment, the plurality of third sub-light-emitting elements may have mutually different shapes or sizes. In an embodiment, outermost light-emitting elements of the plurality of third sub-light-emitting elements, which are disposed at an outermost portion in the first direction, may have a size smaller than a size of at least one central light-emitting element of the plurality of third sub-light-emitting elements. In an embodiment, the outermost light-emitting elements may have mutually different sizes in a substantially circular shape, and the central light-emitting element may have a shape different from a shape of the outermost light-emitting elements. In an embodiment, the central light-emitting element may have a substantially rectangular shape.

In a display device embodiment, the first light-emitting element may include a plurality of first sub-light-emitting elements arranged in the first direction. In an embodiment, the number of the plurality of first sub-light-emitting elements may be different from the number of the plurality of third-sub light-emitting elements. In an embodiment, the second light-emitting element may include a plurality of second sub-light-emitting elements arranged in the first direction, and each of the second sub-light-emitting element may have a substantially circular shape.

In a display device embodiment, centers corresponding to the plurality of third sub-light-emitting elements may be aligned in the first direction. In an embodiment, centers corresponding to the plurality of third sub-light-emitting elements need not be aligned in the first direction. In an embodiment, the centers corresponding to the plurality of third sub-light-emitting elements may be aligned in a fourth direction inclined with respect to the first direction. In an embodiment, the centers corresponding to the plurality of third sub-light-emitting elements may be arranged in a zigzag pattern in the first direction.

In a display device embodiment, each reference pixel unit may include: a first pixel including the first light-emitting element, each of two second pixels including the second light-emitting element, and a third pixel including the third light-emitting element; and at least one photo-sensing element of the plurality of photo-sensing elements may be disposed in each reference pixel unit. In an embodiment, each of the plurality of photo-sensing elements may have a shape different from a shape of the sub-light-emitting elements.

According to an embodiment, a display device comprises: a base layer; and a pixel layer disposed on the base layer and including a plurality of reference pixel units and a plurality of photo-sensing elements, wherein each of the plurality of reference pixel units includes: a first light-emitting element, a second light-emitting element, and a third light-emitting element, and wherein at least one of the first light-emitting element or the third light-emitting element includes a plurality of sub-light-emitting elements, wherein one of the plurality of sub-light-emitting elements, which is closest to a respective one of the plurality of photo-sensing elements, has a substantially circular shape.

In a display device embodiment, the plurality of sub-light-emitting elements may include a plurality of third sub-light-emitting elements arranged in the first direction, and centers of the plurality of third sub-light-emitting elements may be aligned in the first direction. In an embodiment, outermost light-emitting elements of the plurality of third sub-light-emitting elements, which are disposed at an outermost portion in the first direction, may have a shape different from a shape of at least one central light-emitting element disposed between the outermost light-emitting elements. In an embodiment, the central light-emitting element may have a substantially rectangular shape.

BRIEF DESCRIPTION OF THE DRAWINGS

The above and other examples of the present disclosure will become apparent by describing in detail embodiments thereof with reference to the accompanying drawings.

DETAILED DESCRIPTION

Figure 1:
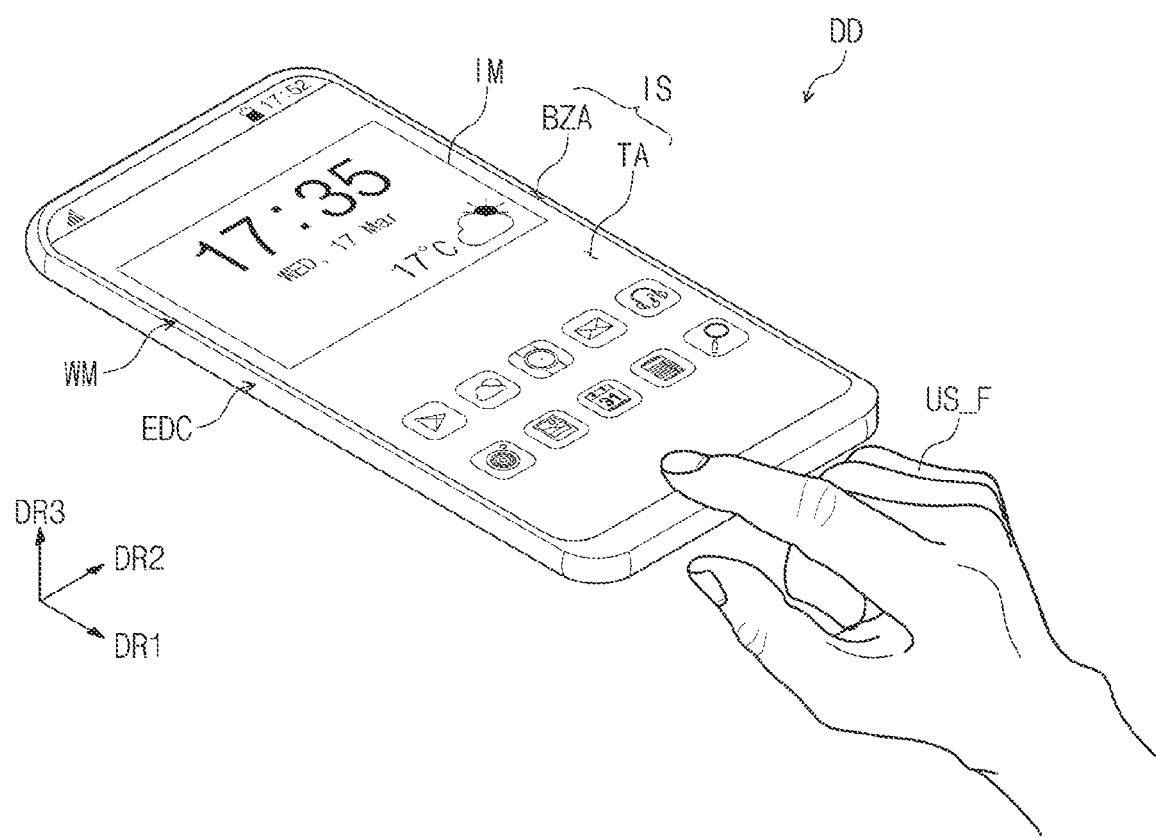
FIG. 1 is a perspective view diagram of a display device according to an embodiment of the present disclosure.

While the present disclosure is susceptible to various modifications and alternative forms, illustrative embodiments thereof are shown by way of example in the drawings and will herein be described in detail. It should be understood, however, that there is no intent to limit the present disclosure to the particular forms disclosed, but on the contrary, the present disclosure is to cover modifications, equivalents, and alternatives falling within the spirit and scope thereof.

In the specification, when one component (or area, layer, part, or the like) is referred to as being "on", "connected to", or "coupled to" another component, it should be understood that the former may be directly on, connected to, or coupled to the latter, and also may be on, connected to, or coupled to the latter via a third intervening component.

The same or like reference numerals may refer to the same or like components. In addition, in drawings, thicknesses, proportions, and dimensions of components may be exaggerated to describe the technical features effectively.

The term "and/or" includes any or all combinations of one or more of the associated components Although the terms "first", "second", or the like may be used to describe various components, the components should not be construed as being limited by the terms. Such terms are used to distinguish one component from another component. For example, without departing from the scope and spirit of the present disclosure, a first component may be referred to as a second component, and similarly, the second component may be referred to as the first component. The singular forms are intended to include the plural forms unless the context clearly indicates otherwise.

In addition, the terms "under", "at a lower portion", "above", and "an upper portion" are used to describe the relationship between components illustrated in drawings. The terms are relative and are described with reference to a direction indicated in the drawing.

Unless otherwise defined, terms (including technical terms and scientific terms) used in the specification have the same meaning as commonly understood by one skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined herein.

It will be further understood that the terms "comprises," "comprising," "includes," or "including," or "having" specify the presence of stated features, numbers, steps, operations, components, parts, or the combination thereof, but do not preclude the presence or addition of one or more other features, numbers, steps, operations, components, components, and/or the combination thereof.

Hereinafter, embodiments of the present disclosure will be described with reference to accompanying drawings.

Figure 2:
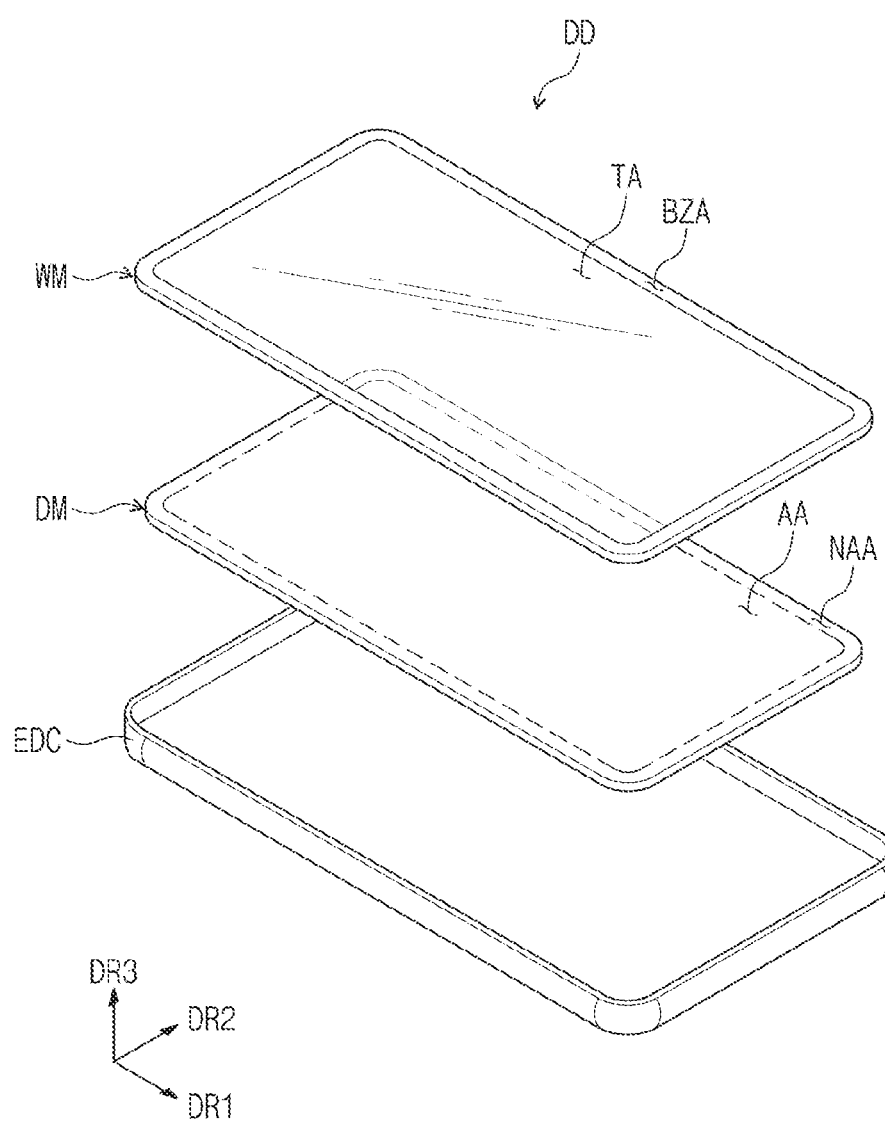
FIG. 2 is an exploded perspective view diagram of a display device according to an embodiment of the present disclosure.
Figure 3:
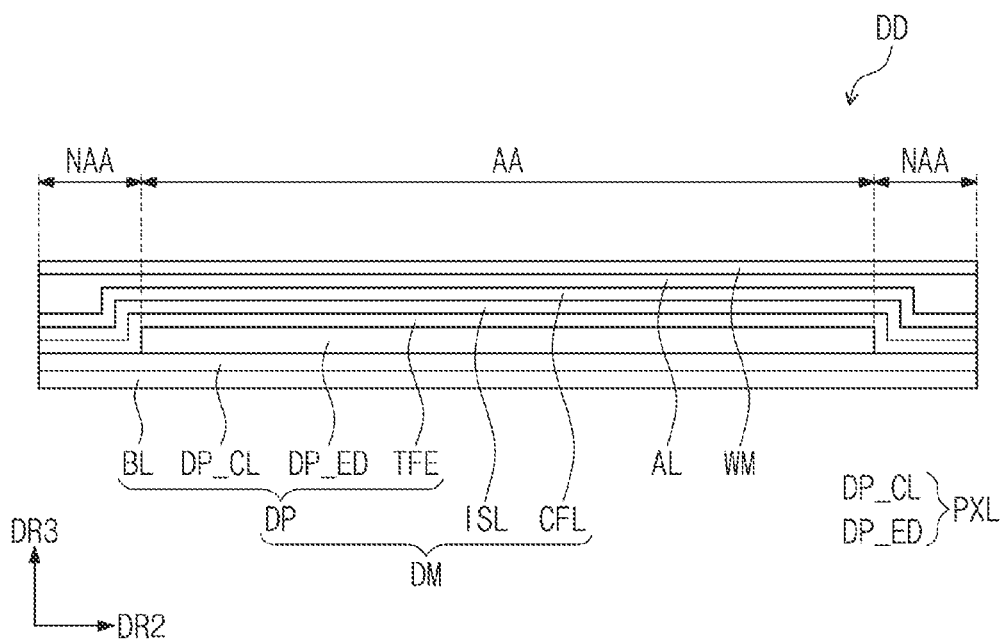
FIG. 3 is a cross-sectional view diagram of a display device according to an embodiment of the present disclosure.

FIG. 1 shows a perspective view of a display device according to an embodiment of the present disclosure. FIG. 2 shows an exploded perspective view illustrating a display device according to an embodiment of the present disclosure. FIG. 3 shows a cross-sectional view of a display device, according to an embodiment of the present disclosure.

Referring to FIGS. 1 and 3, a display device DD according to an embodiment of the present disclosure may have a shape of a rectangle having longer sides parallel to a first direction DR1 and shorter sides parallel to a second direction DR2 crossing the first direction DR1. However, the present disclosure is not limited thereto. For example, the display device DD may have various shapes such as a circle and a polygon, without limitation.

The display device DD may be a device activated in response to an electrical signal. The display device DD may include various embodiments. For example, the display device DD may be applied to an electronic device, such as a smart watch, a tablet PC, a notebook computer, a computer, or a smart television.

Hereinafter, a normal direction, which is substantially perpendicular to a plane defined by the first direction DR1 and the second direction DR2, is defined as a third direction DR3. In the specification, the meaning of "when viewed in a plan view" may refer to "when viewed from the third direction DR3".

A top surface of the display device DD may be defined as a display surface IS and may be parallel to a plane defined by the first direction DR1 and the second direction DR2. Images IM generated by the display device DD may be provided to the user through the display surface IS.

The display surface IS may be divided into a transmission region TA and a bezel region BZA. The transmission region TA may be a region for displaying the images IM. The user visually perceives the images IM through the transmission region TA. According to an embodiment, the transmission region TA is illustrated in the shape of a rectangle having rounded vertexes. However, the shape as shown is merely an illustrative example provided for ease of description. For example, the transmission region TA may have various shapes, and is not limited to any one shape.

The bezel region BZA is adjacent to the transmission region TA. The bezel region BZA may have a specific color. The bezel region BZA may surround the transmission region TA. Accordingly, the shape of the transmission region TA may substantially be defined by the bezel region BZA. However, the above shape of the bezel region BZA is provided by way of example. For example, the bezel region BZA may be disposed adjacent to one side of the transmission region TA or may be omitted.

The display device DD may sense an external input applied from the outside. The external input may include various types of inputs that provided from the outside of the display device DD. For example, in addition to a contact by a part of a body, such as a user hand US_F, or a contact by a separate device (for example, an active pen or a digitizer), the external input may include an external input (e.g., hovering) that is applied in a state where the user hand US_F approaches the display device DD or is adjacent to the display device DD within a specific distance. In addition, the external input may have various types, such as force, pressure, a temperature, light, heat, capacitance, inductance, impedance, or the like.

The display device DD may detect biometric information of the user, such as a fingerprint or an iris scan, applied from the outside. A region for sensing the biometric information may be provided on the display surface IS of the display device DD to sense the biometric information of the user. The region for sensing the biometric information may be provided in the entire portion of the transmission region TA or may be provided in a partial region of the transmission region TA. FIG. 1 illustrates that the entire portion of the transmission region TA may be utilized as the region for sensing the biometric information, according to an embodiment of the present disclosure.

The display device DD may include a window WM, a display module DM, and a housing EDC. According to an embodiment, an appearance of the display device DD may be implemented by combining the window WM and the housing EDC.

A front surface of the window WM defines the display surface IS of the display device DD. The window WM may include an optically transparent material. For example, the window WM may include glass or plastic. The window WM may include a multi-layer structure or a single layer structure. For example, the window WM may include a plurality of plastic films bonded together by an adhesive or may have a glass substrate and a plastic film bonded together by an adhesive.

The display module DM according to an embodiment may be divided into an active region AA and a peripheral region NAA. The active region AA may be activated in response to an electrical signal. As described above, the active region AA may be a part that displays an image or detects an external input.

The peripheral region NAA may be a region positioned adjacent to at least one side of the active region AA. The peripheral region NAA may be disposed to surround the display region AA. However, embodiment are not limited thereto. According to an embodiment, a portion of the peripheral region NAA may be omitted, which is different from that as illustrated in FIG. 2. A driving circuit or driving line to drive the active region AA may be disposed in the peripheral region NAA.

In addition, according to an embodiment, the active region AA of the display module DM may correspond to a portion corresponding to the transmission region TA, and the peripheral region NAA of the display module DM may be a part corresponding to the bezel region BZA.

The display module DM may include a display panel DP and an input sensing layer ISL. The display panel DP may display an image depending on an electrical signal, and the input sensing layer ISL may sense an external input applied from the outside. The external input may be provided in various forms from the outside.

The display panel DP according to an embodiment of the present disclosure may be a light-emitting display panel, and is not particularly limited thereto. For example, the display panel DP may be an organic light-emitting display panel, an inorganic light-emitting display panel, a quantum dot light-emitting display panel, or the like. A light-emitting layer of the organic light-emitting display panel may include an organic light-emitting material, and the light-emitting layer of the inorganic light-emitting display panel may include an inorganic light-emitting material. The light-emitting layer of the quantum dot light-emitting display panel may include a quantum dot, a quantum rod, or the like. Hereinafter, the following description will be made while focusing on the display panel DP as an organic light-emitting display panel, without limitation thereto.

Referring to FIG. 3, the display panel DP includes a base layer BL, a pixel layer PXL, and an encapsulating layer TFE. The display panel DP according to the present disclosure may be a flexible display panel. However, the present disclosure is not limited thereto. For example, the display panel DP may be a foldable display panel, which may be folded about a folding axis, or a rigid display panel.

The base layer BL may include a synthetic resin layer. The synthetic resin layer may be a polyimide-based resin layer, and the material thereof is not particularly limited. Besides, the base layer BL may include a glass substrate, a metal substrate, or an organic/inorganic composite substrate.

The pixel layer PXL is disposed on the base layer BL. The pixel layer PXL may include a circuit layer DP_CL and an element layer DP_ED. The circuit layer DP_CL may be interposed between the base layer BL and the element layer DP_ED. The circuit layer DP_CL may include at least one insulating layer and a circuit element. Below, the insulating layer included in the circuit layer DP_CL is referred to as an "intermediate insulating layer". The intermediate insulating layer may include at least one intermediate inorganic layer and at least one intermediate organic layer. The circuit element may include a pixel driving circuit included in each of a plurality of pixels for displaying an image and a sensor driving circuit included in each of a plurality of sensors for recognizing external information. The external information may be biometric information. As an example of the present disclosure, the sensor may include a fingerprint recognition sensor, a proximity sensor, an iris recognition sensor, a blood measuring sensor, or an illuminance sensor. Moreover, the sensor may include an optical sensor that recognizes biometric information in an optical manner. The circuit layer DP_CL may further include signal lines connected with the pixel driving circuit and the sensor driving circuit.

The element layer DP_ED may include a light-emitting element included in each of the pixels and a photo-sensing element included in each of the sensors. According to an embodiment of the present disclosure, the photo-sensing element may be a photodiode. The photo-sensing element may be a sensor that senses light reflected by a fingerprint of the user or reacts to such light.

The encapsulation layer TFE is disposed on the element layer DP_ED to encapsulate the element layer DP_ED. The encapsulation layer TFE may include at least one organic layer and at least one inorganic layer. The inorganic layer may include inorganic materials and may protect the element layer DP_ED from moisture/oxygen. The inorganic layer may include a silicon nitride layer, a silicon oxynitride layer, a silicon oxide layer, a titanium oxide layer, or an aluminum oxide layer, but is not limited thereto. The organic layer may include an organic material and may protect the element layer DP_ED from foreign objects such as dust particles.

The input sensing layer ISL may be formed on the display panel DP. The input sensing layer ISL may be directly disposed on the encapsulation layer TFE. According to an embodiment of the present disclosure, the input sensing layer ISL may be formed on the display panel DP through a subsequent process. In other words, when the input sensing layer ISL is directly disposed on the display panel DP, an adhesive film need not be interposed between the input sensing layer ISL and the encapsulation layer TFE. However an inner adhesive film may be disposed between the input sensing layer ISL and the display panel DP. In this case, the input sensing layer ISL need not be manufactured through a process subsequent to the process of the display panel DP. In other words, the input sensing layer ISL may be manufactured through a process separate from the process of the display panel DP and may then be fixed on a top surface of the display panel DP by the adhesive film.

The input sensing layer ISL may sense an external input (for example, a touch of the user), may convert the sensed input into a specific input signal, and may provide the input signal to the display panel DP. The input sensing layer ISL may include a plurality of sensing electrodes to sense the external input. The sensing electrodes may sense the external input in a capacitive manner. The display panel DP may receive the input signal from the input sensing layer ISL and may generate an image corresponding to the input signal.

The display module DM may further include a color filter layer CFL. According to an embodiment of the present disclosure, the color filter layer CFL may be disposed on the input sensing layer ISL. However, the present disclosure is not limited thereto. The color filter layer CFL may be disposed between the display panel DP and the input sensing layer ISL. The color filter layer CFL may include a plurality of color filters and/or a black matrix.

A structure of the input sensing layer ISL and the color filter layer CFL may be described in greater detail, infra.

The display device DD according to an embodiment of the present disclosure may further include an adhesive layer AL. The window WM may be attached to the input sensing layer ISL by the adhesive layer AL. The adhesive layer AL may include an optical clear adhesive, an optically clear adhesive resin, or a pressure sensitive adhesive (PSA).

Referring to FIGS. 1 and 2, the housing EDC is coupled to the window WM. The housing EDC is coupled to the window WM to provide a specific inner space. The display module DM may be received in the inner space. The housing EDC may include a material having higher rigidity. For example, the housing EDC may include glass, plastic, or metal or may include a plurality of frames and/or plates that are composed of a combination thereof. The housing EDC may stably protect components of the display device DD received in the inner space from an external impact. A battery module to supply power for overall operation of the display device DD may be interposed between the display module DM and the housing EDC.

Figure 4:
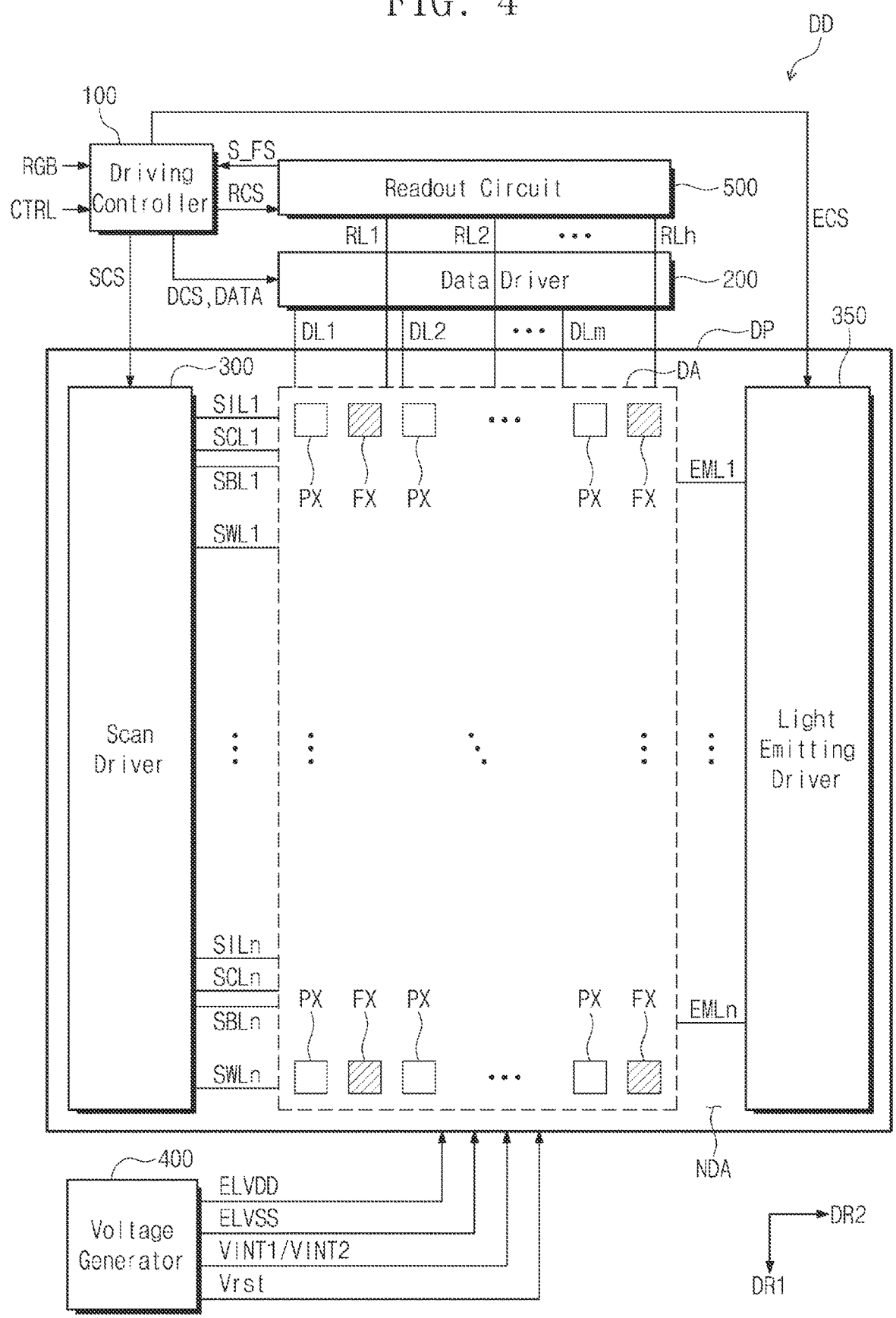
FIG. 4 is a block diagram illustrating a display device according to an embodiment of the present disclosure.

FIG. 4 shows a display device according to an embodiment of the present disclosure.

Referring to FIG. 4, the display device DD includes the display panel DP, a panel driver, and a driving controller 100. According to an embodiment of the present disclosure, the panel driver includes a data driver 200, a scan driver 300, a light-emitting driver 350, a voltage generator 400, and a readout circuit 500.

The driving controller 100 receives an image signal RGB and a control signal CTRL. The driving controller 100 generates an image data signal DATA by converting a data format of the image signal RGB in compliance with the specification for an interface with the data driver 200. The driving controller 100 outputs a first control signal SCS, a second control signal ECS, a third control signal DCS, and a fourth control signal RCS; and may receive processed sensing signals S_FS from the readout circuit 500.

The data driver 200 receives the third control signal DCS and the image data signal DATA from the driving controller 100. The data driver 200 converts the image data signal DATA into data signals, and outputs the data signals to a plurality of data lines DL1 to DLm, which may be described in greater detail, infra. The data signals refer to analog voltages corresponding to a gray scale value of the image data signal DATA.

The scan driver 300 receives the first control signal SCS from the driving controller 100. The scan driver 300 may output scan signals to scan lines in response to the first control signal SCS.

The voltage generator 400 generates voltages for an operation of the display panel DP. According to an embodiment, the voltage generator 400 generates a first driving voltage ELVDD, a second driving voltage ELVSS, a first initialization voltage VINT1, and a second initialization voltage VINT2.

The display panel DP may include a display region DA corresponding to the transmission region TA (illustrated in FIG. 1) and a non-display region NDA corresponding to the bezel region BZA (illustrated in FIG. 1).

The display panel DP may include a plurality of pixels PX disposed in the display region DA and a plurality of sensors FX disposed in the display panel DP. According to an embodiment of the present disclosure, each of the plurality of sensors FX may be interposed between two pixels PX. The plurality of pixels PX and the plurality of sensors FX may be alternately disposed in the first and second directions DR1 and DR2. However, the present disclosure is not limited thereto. In other words, at least two pixels may be interposed between two sensors of the plurality of sensors FX, which are adjacent to each other when viewed in the first direction DR1, or at least two pixels PX may be disposed between two sensors of the plurality of sensors FX, which are adjacent to each other when viewed in the second direction DR2.

The display panel DP further includes initialization scan lines SIL1 to SILn, compensation scan lines SCL1 to SCLn, white scan lines SWL1 to SWLn, black scan lines SBL1 to SBLn, light-emitting control lines EML1 to EMLn, data lines DL1 to DLm, and readout lines RL1 to RLh. The initialization scan lines SIL1 to SILn, the compensation scan lines SCL1 to SCLn, the white scan lines SWL1 to SWLn, the black scan lines SBL1 to SBLn, and the light-emitting control lines EML1 to EMLn extend in the second direction DR2. The initialization scan lines SIL1 to SILn, the compensation scan lines SCL1 to SCLn, the white scan lines SWL1 to SWLn, the black scan lines SBL1 to SBLn, and the light-emitting control lines EML1 to EMLn are arranged to be spaced from each other in the first direction DR1. The data lines DL1 to DLm and the readout lines RL1 to RLh extend in the first direction DR1 and are arranged to be spaced from each other in the second direction DR2.

The plurality of pixels PX are electrically connected with the initialization scan lines SIL1 to SILn, the compensation scan lines SCL1 to SCLn, the white scan lines SWL1 to SWLn, the black scan lines SBL1 to SBLn, the light-emitting control lines EML1 to EMLn, and the data lines DL1 to DLm. For example, each of the plurality of pixels PX may be electrically connected with four scan lines. However, the number of scan lines, which are connected to each pixel PX, is not limited thereto, but the number of scan lines and the number of light-emitting control lines may be varied.

The plurality of sensors FX may be electrically connected with white scan lines SWL1 to SWLn, and the readout lines RL1 to RLh. Each of the plurality of sensors FX may be electrically connected with one scan line. However, the present disclosure is not limited thereto. The number of scan lines connected to each sensor FX may be varied. According to an embodiment of the present disclosure, the number of readout lines RL1 to RLh may correspond to ½ of the number of data lines DL1 to DLm. However, the present disclosure is not limited thereto. Alternatively, the number of readout lines RL1 to RLh may correspond to ¼ or ⅛ of the number of data lines DL1 to DLm.

The scan driver 300 may be disposed in the non-display region NDA of the display panel DP. The scan driver 300 receives the first control signal SCS from the driving controller 100. In response to the first control signal SCS, the scan driver 300 outputs initialization scan signals to the initialization scan lines SIL1 to SILn and may output compensation scan signals to the compensation scan lines SCL1 to SCLn. In addition, the scan driver 300 may output write scan signals to the white scan lines SWL1 to SWLn and may output black scan signals to the black scan lines SBL1 to SBLn, in response to the first control signal SCS. Alternatively, the scan driver 300 may include a first scan driver and a second scan driver. The first scan driver may output the initialization scan signals and the compensation scan signals, and the second scan driver may output the write scan signals and the black scan signals.

The light-emitting driver 350 may be disposed in the non-display region NDA of the display panel DP. The light-emitting driver 350 receives the second control signal ECS from the driving controller 100. The light-emitting driver 350 may output light-emitting control signals to the light-emitting control lines EML1 to EMLn in response to the second control signal ECS. Alternatively, the scan driver 300 may be connected with the light-emitting control lines EML1 to EMLn. In this case, the light-emitting driver 350 may be output, and the scan driver 300 may output the light-emitting control signals to the light-emitting control lines EML1 to EMLn.

The readout circuit 500 receives the fourth control signal RCS from the driving controller 100. The readout circuit 500 may receive readout signals from the readout lines RL1 to RLh, in response to the fourth control signal RCS. The readout circuit 500 may process the readout signals received from the readout lines RL1 to RLh to generate the sensing signals S_FS, and may provide the processed sensing signals S_FS to the driving controller 100. The driving controller 100 may recognize biometric information based on the sensing signals S_FS.

Figure 5A:
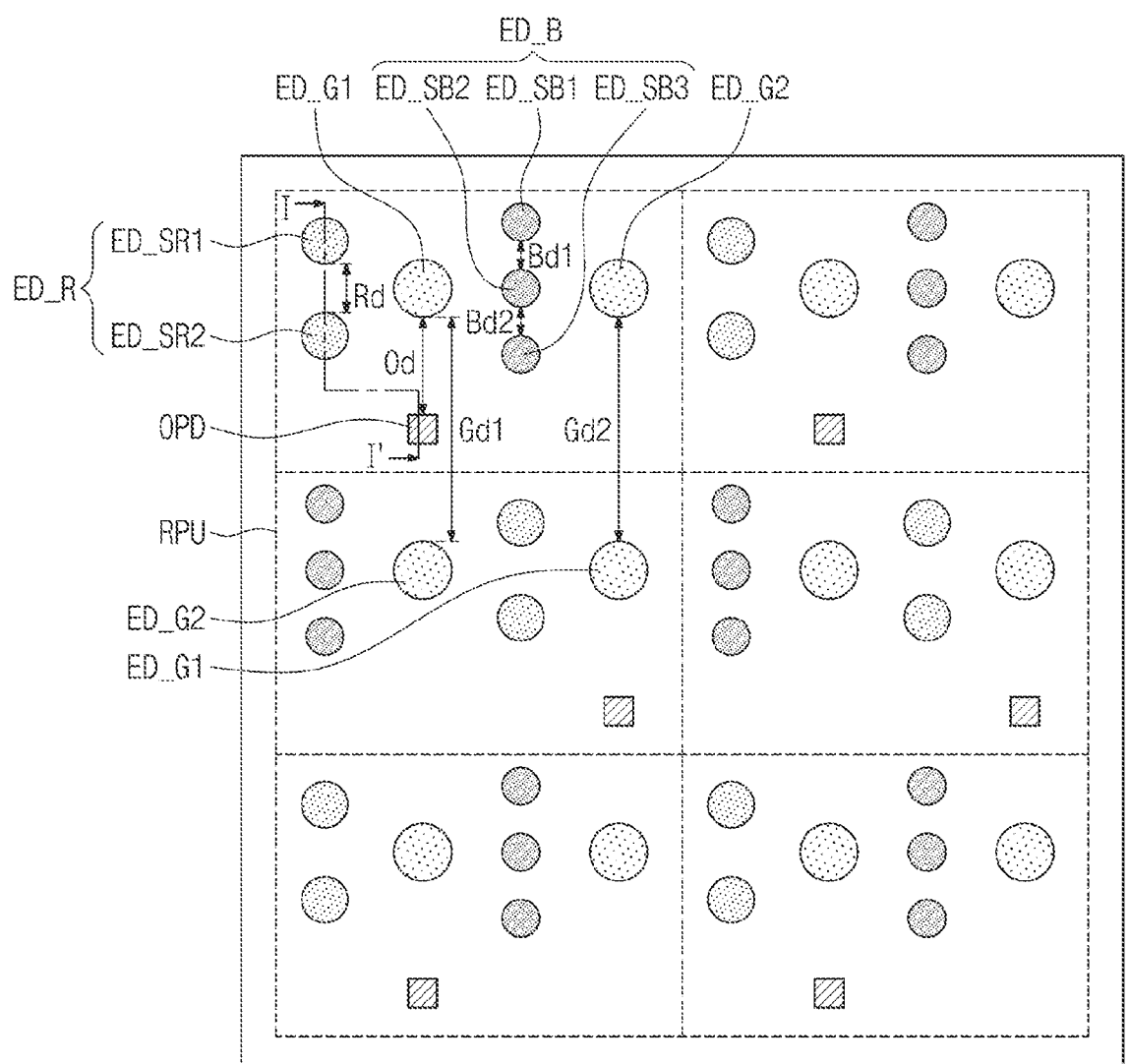
FIG. 5A is a plan view diagram illustrating a portion of a display panel according to an embodiment of the present disclosure.
Figure 5B:
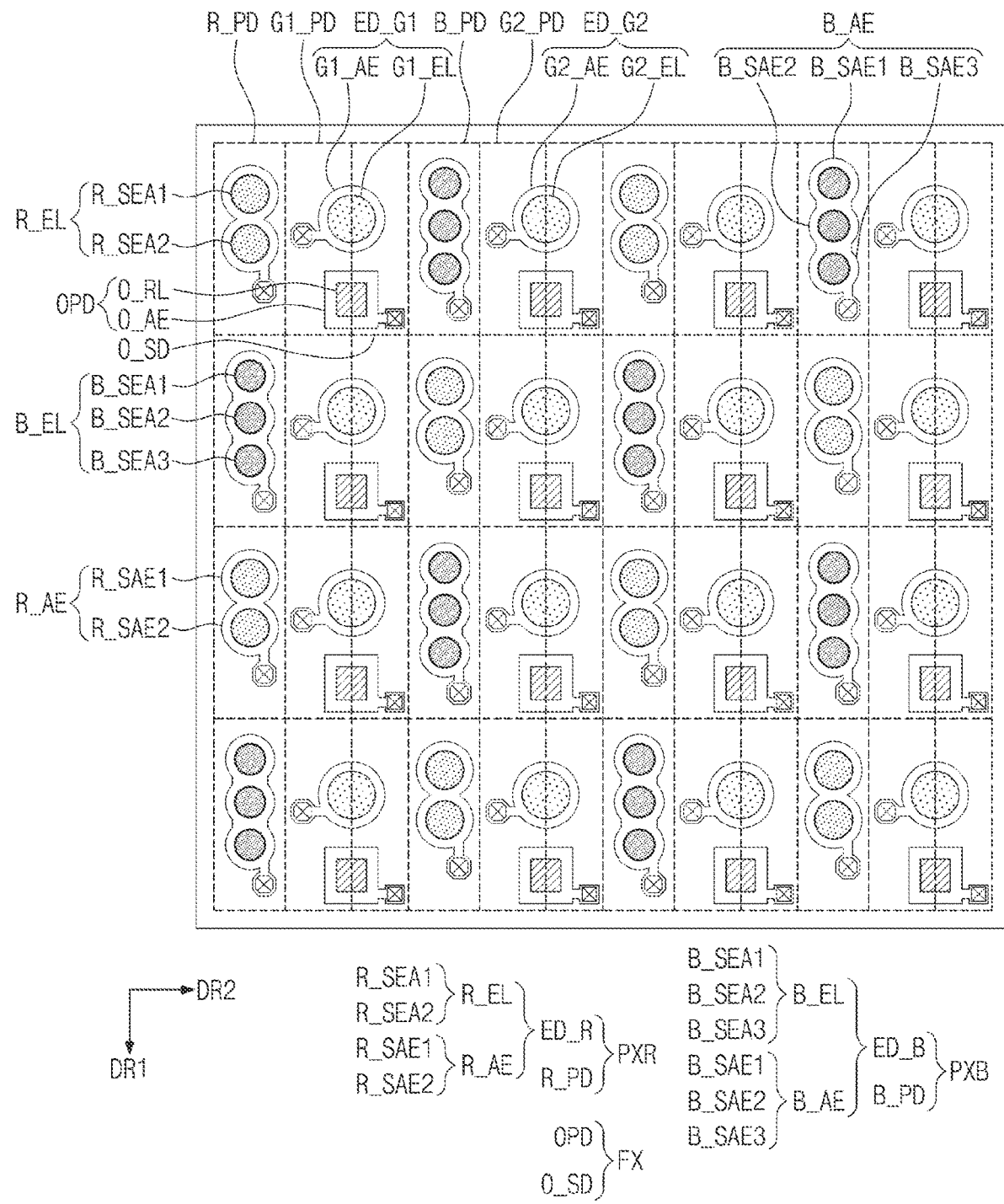
FIG. 5B is a plan view diagram illustrating a connection relationship between a photo-sensing element and a sensor driving circuit according to an embodiment of the present disclosure.
Figure 5C:
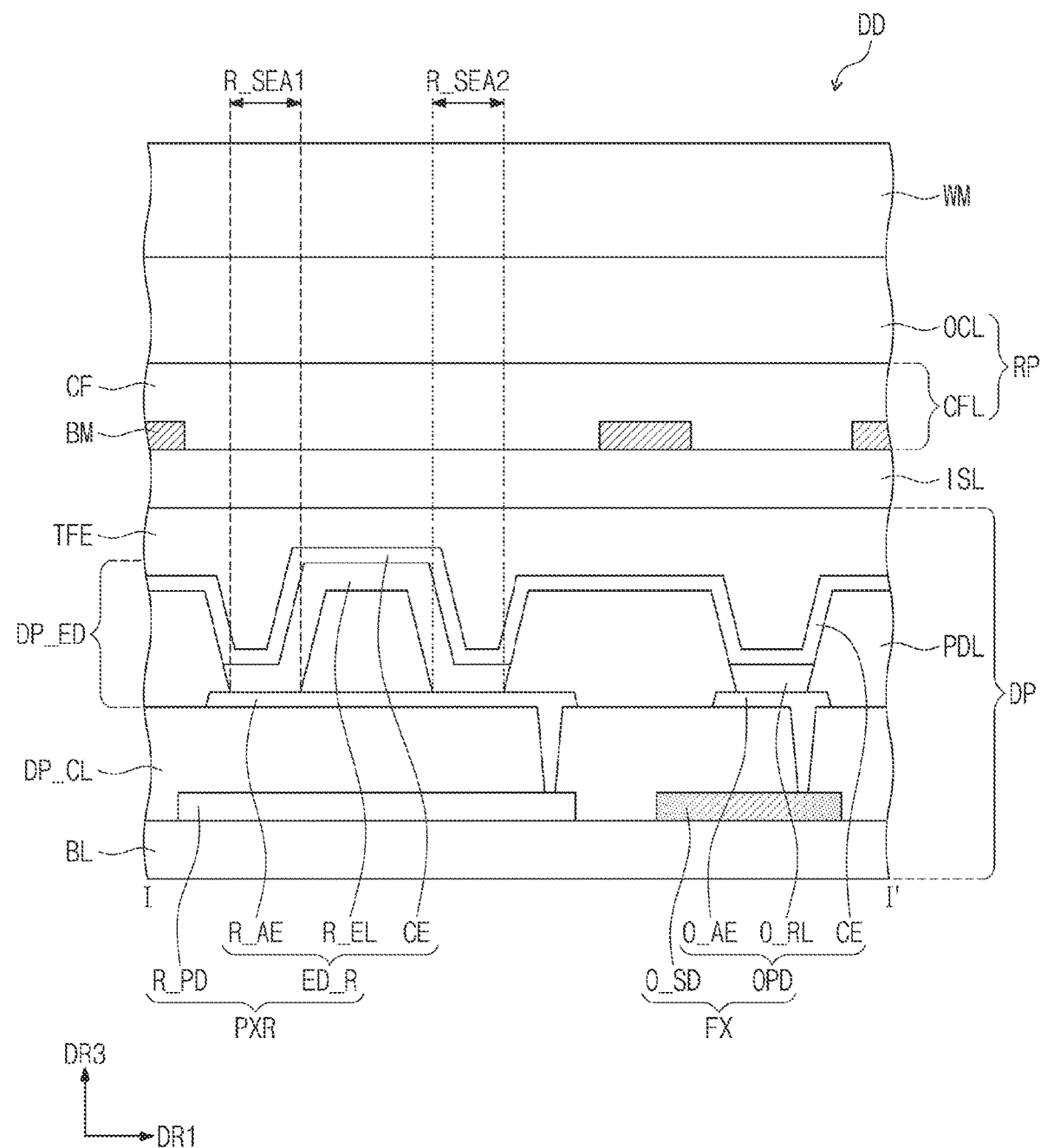
FIG. 5C is a cross-sectional view diagram illustrating a display device taken along line I-I' illustrated in FIG. 5A.

FIG. 5A is a plan view illustrating a portion of a display panel according to an embodiment of the present disclosure. FIG. 5B is a plan view illustrating a connection relationship between a photo-sensing element and a sensor driving circuit according to an embodiment of the present disclosure. FIG. 5C is a cross-sectional view illustrating a display device taken along line I-I' illustrated in FIG. 5A.

Referring to FIGS. 5A and 5B, the display panel DP includes a plurality of pixels PXR, PXG2, and PXB, and a plurality of sensors FX.

The plurality of pixels PXR, PXG1, PXG2, and PXB may be grouped into a plurality of reference pixel units RPU. According to an embodiment of the present disclosure, each reference pixel unit RPU may include four pixels, that is, a first pixel PXR (hereinafter, a red pixel), two second pixels PXG1 and PXG2 (hereinafter, first and second green pixels), and a third pixel PXB (hereinafter, a blue pixel). However, the number of pixels included in each reference pixel unit RPU is not limited thereto. Alternatively, each reference pixel unit RPU may include three pixels, that is, the red pixel PXR, the first green pixel PXG1 or the second green pixel PXG2, and a blue pixel PXB.

The red pixel PXR includes a first light-emitting element ED_R (hereinafter, a red light-emitting element), each of the first and second green pixels PXG1 and PXG2 includes second light-emitting elements ED_G1 and ED_G2 (hereinafter, the first and second green light-emitting elements), respectively, and the blue pixel PXB includes a third light-emitting element ED_B. According to an embodiment of the present disclosure, the red light-emitting element ED_R outputs first color light (for example, a red light), the first and second green light-emitting elements ED_G1 and ED_G2 outputs the second color light (for example, green light), and a blue light-emitting element ED_B outputs third color light (for example, blue light).

The red light-emitting elements ED_R and the blue light-emitting element ED_B may be alternately arranged in the first direction DR1. The first green light-emitting elements ED_G1 may be arranged in the first direction DR1 and the second green light-emitting elements ED_G2 may be arranged in the first direction DR1. The first and second green light-emitting elements ED_G1 and ED_G2 may be interposed between the red light-emitting elements ED_R and the blue light-emitting elements ED_B. The first and second green light-emitting elements ED_G1 and ED_G2 may be alternately arranged in the second direction DR2.

The red light-emitting element ED_R may include a plurality of sub-red light-emitting elements ED_SR1, ED_SR2 and ED_SR3. According to an embodiment of the present disclosure, the plurality of sub-red light-emitting elements ED_SR1, ED_SR2 and ED_SR3 may include a first sub-red light-emitting element ED_SR1 and a second sub-red light-emitting element ED_SR2. The first sub-red light-emitting element ED_SR1 and the second sub-red light-emitting element ED_SR2 include a first sub-red light-emitting region R_SEA1 and a second sub-red light-emitting region R_SEA2. The first sub-red light-emitting region R_SEA1 and the second sub-red light-emitting region R_SEA2 may be spaced apart from each other in the first direction DR1. The first sub-red light-emitting element ED_SR1 and the second sub-red light-emitting element ED_SR2 may be electrically connected to each other. In other words, the first sub-red light-emitting element ED_SR1 and the second sub-red light-emitting element ED_SR2 may share one red anode electrode R_AE. Accordingly, the first sub-red light-emitting element ED_SR1 and the second sub-red light-emitting element ED_SR2 may be simultaneously turned on and turned off.

The sub-red light-emitting elements of the present embodiment may emit substantially the same wavelengths of light. In an alternate embodiment, at least one of the sub-red light-emitting elements may be configured to emit a slightly different wavelength of light to address at least one human color vision anomaly.

The sum of the areas of the first sub-red light-emitting element ED_SR1 and the second sub-red light-emitting element ED_SR2 may be same as the area of the red light-emitting element ED_R. As illustrated in FIG. 5A, the first sub-red light-emitting element ED_SR1 and the second sub-red light-emitting element ED_SR2 have the same size and the same shape (for example, a circular shape). However, the shapes of the sub-red light-emitting elements ED_SR1 and ED_SR3 are not limited thereto. The shape of each of the sub-red light-emitting elements ED_SR1 and ED_SR2 may be variously deformed.

The blue light-emitting element ED_B may include a plurality of sub-blue light-emitting elements ED_SB1, ED_SB2 and ED_SB3. According to an embodiment of the present disclosure, the plurality of sub-blue light-emitting elements ED_SB1, ED_SB2 and ED_SB3 may include the first sub-blue light-emitting element ED_SB1, the second sub-blue light-emitting element ED_SB2, and the third sub-blue light-emitting element ED_SB3. The first sub-blue light-emitting element ED_SB1, the second sub-blue light-emitting element ED_SB2, and the third sub-blue light-emitting element ED_SB3 include the first sub-blue light-emitting region B_SEA1, the second sub-blue light-emitting region B_SEA2, and the third sub-blue light-emitting region B_SEA3. The first sub-blue light-emitting region B_SEA1, the second sub-red light-emitting region B_SEA2, and the third sub-blue light lighting region B_SEA3 may be spaced apart from each other in the first direction DR1. The first sub-blue light-emitting element ED_SB1, the second sub-blue light-emitting element ED_SB2, and the third sub-blue light-emitting element ED_SB3 may be electrically connected to each other. In other words, the first sub-blue light-emitting element ED_SB1, the second sub-blue light-emitting element ED_SB2, and the third sub-blue light-emitting element ED_SB3 may share one blue anode electrode B_AE. Accordingly, the first sub-blue light-emitting element ED_SB1, the second sub-blue light-emitting element ED_SB2, and the third sub-blue light-emitting element ED_SB3 may be simultaneously turned on and turned off.

The sub-blue light-emitting elements of the present embodiment may emit substantially the same wavelengths of light. In an alternate embodiment, at least one of the sub-blue light-emitting elements may be configured to emit a slightly different wavelength of light to address at least one human color vision anomaly.

The sum of the areas of the first sub-blue light-emitting element ED_SB1, the second sub-_blue light-emitting element ED_SB2, and the third sub-blue light-emitting element ED_SB3 may be defined to the area of the blue light-emitting element ED_B. Referring to FIG. 5A, the first sub-blue light-emitting element ED_SB1, the second sub-blue light-emitting element ED_SB2, and the third sub-red light-emitting element ED_SB3 have the same size and the same shape (for example, a circular shape). However, the shapes of the sub-blue light-emitting elements ED_SB1, ED_SR2 and ED_SR3 are not limited thereto. The shape of each of the sub-red light-emitting elements ED_SB1 and ED_SB2 may be variously deformed.

A first distance Bd1 between the first sub-blue light-emitting element ED_SB1 and the second sub-blue light-emitting element ED_SB2 may be equal to a second distance Bd2 between the second sub-blue light-emitting element ED_SB2 and the third sub-blue light-emitting element ED_SB3. However, the present disclosure is not limited thereto. For example, the first distance Bd1 may be different from the second distance Bd2. Each of the first and second distances Bd1 and Bd2 may have a value greater than or equal to a minimum interval (hereinafter, referred to as a minimum process distance) that is supported in the mask process. For example, each of the first and second distances Bd1 and Bd2 may be set to between about 5 µm or more and about 6.5 µm or less.

A third distance Rd between the first sub-red light-emitting element ED_SR1 and the second sub-red light-emitting element ED_SR2 may be greater than or equal to the first distance Bd1 and the second distance Bd2. The third distance Rd may be set to a value equal to or greater than the minimum process distance.

Referring to FIG. 5A, the first and second green light-emitting elements ED_G1 and ED_G2 have the same shape and the same size. However, the shapes and sizes of the first and second green light-emitting elements ED_G1 and ED_G2 are not limited thereto. The shape of each of the first and second green light-emitting elements ED_G1 and ED_G2 may be variously modified.

An area of each of the first and second green light-emitting elements ED_G1 and ED_G2 may be smaller than or equal to an area of the red light-emitting element ED_R, and may be smaller than or equal to an area of the blue light-emitting element ED_B.

According to an embodiment of the present disclosure, each of the first and second green light-emitting elements ED_G1 and ED_G2 may have a size greater than or equal to a size of each the sub-red light-emitting elements ED_SR1, and ED_SR2 and the sub-blue light-emitting elements ED_SB1, ED_SB2, and ED_SB3. In addition, the sub-red light-emitting elements ED_SR1 and ED_SR2 may be larger than the sub-blue light-emitting elements ED_SB1, ED_SB2, and ED_SB3. However, the sizes of the sub-red light-emitting elements ED_SR1, and ED_SR2 and the sub-blue light-emitting elements ED_SB1, ED_SB2, and ED_SB3 are not limited thereto as shown. For example, each of the sub-red light-emitting elements ED_SR1 and ED_SR2 and the sub-blue light-emitting elements ED_SB1, ED_SB2, and ED_SB3 may have equal sizes.

The sub-red light-emitting elements ED_SR1 and ED_SR2 may have the same shape as the sub-blue light-emitting elements ED_SB1, ED_SB2, and ED_SB3. According to an embodiment of the present disclosure, each of the sub-red light-emitting elements ED_SR1 and ED_SR2 and the sub-blue light-emitting elements ED_SB1, ED_SB2, and ED_SB3 may have a circular shape. However, the present disclosure is not limited thereto, each of the sub-red light-emitting elements ED_SR1 and ED_SR2 and the sub-blue light-emitting elements ED_SB1, ED_SB2, and ED_SB3 may have a polygonal shape (for example, a square shape or octagonal shape). Alternatively, the sub-red light-emitting elements ED_SR1 and ED_SR2 and the sub-blue light-emitting elements ED_SB1, ED_SB2, and ED_SB3 may have different shapes.

Each of a plurality of sensors FX includes at least one photo-sensing element OPD. The photo-sensing element OPD may be a device that receives light reflected from an external object (e.g., a user hand US_F (see FIG. 1) and incident thereon to the photo-sensing element OPD. According to an embodiment of the present disclosure, although FIG. 5A illustrates that each sensor FX includes one photo-sensing element OPD, the present disclosure is not limited thereto. For example, each sensor FX may include two or more photo-sensing elements.

According to an embodiment of the present disclosure, the photo-sensing element OPD may be disposed to correspond to one reference pixel unit RPU. However, the number of photo-sensing elements OPD included in each reference pixel unit RPU is not limited thereto. For example, two photo-sensing elements OPD may be disposed to correspond to each reference pixel unit RPU.

According to an embodiment of the present disclosure, the photo-sensing element OPD may be disposed to be adjacent to the first green light-emitting element ED_G1 or the second green light-emitting element ED_G2 in the first direction DR1. When the photo-sensing element OPD is disposed to be adjacent to the second green light-emitting element ED_G2 in the first direction D1 in the reference pixel unit RPU, the photo-sensing element OPD is disposed to be adjacent to the first green light-emitting element ED_G2 in the first direction DR1 in another reference pixel unit RPU adjacent to the reference pixel unit RPU.

The photo-sensing element OPD may have a size smaller sizes of the sub-red light-emitting elements ED_SR1 and ED_SR2 and the sub-blue light-emitting elements ED_SB1, ED_SB2, and ED_SB3. However, the size of the photo-sensing element OPD is not limited as shown. The photo-sensing element OPD may have a shape different from shapes of the sub-red light-emitting elements ED_SR1 and ED_SR2 and the sub-blue light-emitting elements ED_SB1, ED_SB2, and ED_SB3. According to an embodiment of the present disclosure, the photo-sensing element OPD may have a square shape having equal lengths in the first direction DR1 and the second direction DR2. When the photo-sensing element OPD has the square shape, the photo-sensing element OPD may ensure a sufficient area with respect to the relationships of the light-emitting elements ED_R, ED_G1, ED_G2, and ED_B, such that the sensing ability may be maximized. However, the present disclosure is not limited thereto. The photo-sensing element OPD may have the shape of a rectangle having a longer length in the first direction DR1 instead of the second direction DR2.

When the first green light-emitting element ED_G1 and the photo-sensing element OPD is disposed at the distance shorter than a reference value or more, it may be difficult for light, which is emitted from the first green light-emitting element ED_G1, to be reflected from a fingerprint FGP (see FIG. 1) and incident to the photo-sensing element OPD in the form of the reflection light IP-L (see FIG. 1). Accordingly, a fourth distance Od between the first green light-emitting element ED_G1 and the photo-sensing element OPD may be set to a reference value (e.g., about 19.5 μm) or more for smooth light sensing of the photo-sensing element OPD. As illustrated, the first green light-emitting element ED_G1 is spaced apart from the second green light-emitting element ED_G2, which is provided in another reference pixel unit RPU, by the fifth distance Gd1, when viewed in the first direction D1. The second green light-emitting element ED_G2 is spaced apart from the first green light-emitting element ED_G1, which is provided in another reference pixel unit RPU, by the sixth distance Gd2, when viewed in the first direction DR1. The fifth distance Gd1 and the sixth distance Gd2 may be equal to each other or different from each other. In detail, when the photo-sensing element OPD is absent between the first green light-emitting element ED_G1 and the second green light-emitting element ED_G2, the distance, that is, the sixth distance Gd2 between the first green light-emitting element ED_G1 and the second green light-emitting element ED_G2, may be smaller than the fifth distance Gd1 present between the first green light-emitting element ED_G1 and the second green light-emitting element ED_G2, when viewed in the first direction DR1.

The blue light-emitting element ED_B is implemented by using a plurality of sub-blue light-emitting elements ED_SB1, ED_SB2, and ED_SB3, and a space for disposing the photo-sensing element OPD may be ensured in the reference pixel unit RPU in the same resolution. Accordingly, the sensing ability of the sensors FX may be maximized.

In addition to the blue light-emitting element ED_B, the red light-emitting element ED_R may be implemented by using the plurality of sub-red light-emitting elements ED_SR1 and ED_SR2 having sizes smaller than or equal to the first and second green light-emitting elements ED_G1 and ED_G2. Accordingly, the space for disposing the photo-sensing element OPD may be more largely ensured in each reference pixel unit RPU in the same resolution. As a result, the sensing ability of the sensors FX may be maximized.

Referring to FIG. 5B, each reference pixel unit RPU may include a red pixel PXR, first and second green pixels PXG1 and PXG2, and a blue pixel PXB. The red pixel PXR includes a red light-emitting element ED_R and a red pixel driving circuit R_PD, and the blue pixel PXB includes a blue light-emitting element ED_B and a blue pixel driving circuit B_PD. The first green pixel PXG1 includes a first green light-emitting element ED_G1 and a first green pixel driving circuit G1_PD, and the second green pixel PXG2 includes a second green light-emitting element ED_G2 and a second green pixel driving circuit G2_PD.

The red light-emitting element ED_R is electrically connected to the red pixel driving circuit R_PD. The red light-emitting element ED_R includes a red anode electrode R_AE and a red light-emitting layer R_EL, and the red anode electrode R_AE is connected to the red pixel driving circuit R_PD through a contact hole. The red light-emitting layer R_EL may include a first sub-red light-emitting region R_SEA1 and a second sub-red light-emitting region R_SEA2. The first sub-red light-emitting region R_SEA1 corresponds to the first portion R_SAE1 of the red anode electrode R_AE, and the second sub-red light-emitting region R_SEA2 corresponds to the second portion R_SAE2 of the red anode electrode R_AE.

The first sub-red light-emitting region R_SEA1 and the first part R_SAE1 of the red anode electrode R_AE may correspond to the first sub-red light-emitting element ED_SR1 illustrated in FIG. 5A, and the second sub-red light-emitting region R_SEA2 and the second part R_SAE2 of the red anode electrode R_AE may correspond to the second sub-red light-emitting element ED_SR2. Since the first sub-red light-emitting element ED_SR1 and the second sub-red light-emitting element ED_SR2 share the red anode electrode R_AE, the first sub-red light-emitting element ED_SR1 and the second sub-red light-emitting element ED_SR2 may be simultaneously turned on and turned off.

The first green light-emitting element ED_G1 is electrically connected to the first green pixel driving circuit G1_PD. In detail, the first green light-emitting element ED_G1 includes a first green anode electrode G1_AE and the first green light-emitting layer G1_EL, and the first green anode electrode G1_AE is connected to the first green pixel driving circuit G1_PD through a contact hole. The second green light-emitting element ED_G2 is electrically connected to the second green pixel driving circuit G2_PD. In detail, the second green light-emitting element ED_G2 includes the second green anode electrode G2_AE and the second green light-emitting layer G2_EL, and the second green anode electrode G2_AE is connected to the second green pixel driving circuit G2_PD through the contact hole.

The blue light-emitting element ED_B is electrically connected to the blue pixel driving circuit B_PD. The blue light-emitting element ED_B includes a blue anode electrode B_AE and a blue light-emitting layer B_EL, and the blue anode electrode B_AE is connected to the blue pixel driving circuit B_PD through a contact hole. The blue light-emitting layer B_EL may include a first sub-blue light-emitting region B_SEA1, a second sub-blue light-emitting region B_SEA2, and a third sub-blue light-emitting region B_SEA3. The first sub-blue light-emitting region B_SEA1 corresponds to the first part B_SAE1 of the blue anode electrode R_AE, the second sub-blue light-emitting region B_SAE2 correspond to the second part B_SAE2 of the blue anode electrode R_AE, and the third sub-blue light-emitting region B_SEA3 correspond to the third part B_SAE3 of the blue anode R_AE3.

The first sub-blue light-emitting region B_SEA1 and the first part B_SAE1 of the blue anode R_AE correspond to the first sub-blue light-emitting element ED_SB1 illustrated in FIG. 5A. The second sub-blue light-emitting region B_SEA2 and the second part B_SAE2 of the blue anode electrode R_AE may correspond to the second sub-blue light-emitting element ED_SB2 illustrated in FIG. 5A. The third sub-blue light-emitting region B_SEA3 and the third part B_SAE3 of the blue anode electrode R_AE may correspond to the third sub-blue light-emitting element ED_SB3 illustrated in FIG. 5A. Accordingly, the first sub-blue light-emitting element ED_SB1, the second sub-blue light-emitting element ED_SB2, and the third sub-blue light-emitting element ED_SR3 share the blue anode electrode R_BE, and thus may be turned on or turned off.

Each of the sensors FX includes the photo-sensing element OPD and the sensor driving circuit O_SD. According to an embodiment of the present disclosure, the photo-sensing element OPD is connected to the sensor driving circuit O_SD. According to an embodiment of the present disclosure, the sensor driving circuit O_SD may have the same length as those of the red and blue pixel driving circuits R_PD and B_PD when viewed in the first direction DR1, without limitation thereto.

The photo-sensing element OPD includes the photo-sensing anode electrode O_AE and the photoelectric conversion layer O_RL, and the photo-sensing anode electrode O_AE is directly connected to the sensor driving circuit O_SD through the contact hole. The sensor driving circuit O_SD may be disposed to be overlapped with the photo-sensing element OPD.

When each sensor FX includes at least two photo-sensing elements OPD, the at least two photo-sensing elements OPD may be connected to the sensor driving circuit O_SD through routing lines. Accordingly, the photo-sensing elements may be simultaneously turned on or turned off by the sensor driving circuit O_SD.

The sensor driving circuit O_SD may include a plurality of transistors. According to an embodiment of the present disclosure, the sensor driving circuit O_SD and the pixel driving circuits R_PD, G1_PD, G2_PD, and B_PD may be formed through the same process. In addition, the scan driver 300 (see FIG. 4) may include transistors formed through the same process as the sensor driving circuit O_SD and the pixel driving circuits R_PD, G1_PD, G2_PD, and B_PD.

Referring to FIG. 5C, the element layer DP_ED may be disposed on the circuit layer DP_CL. The element layer DP_ED may include light-emitting elements ED_R, ED_G1, ED_G2, and ED_B and the photo-sensing element OPD. FIG. 5C representatively illustrates the red light-emitting element ED_R. The description of the first green light-emitting element ED_G1, the second green light-emitting element ED_G2, and the blue light-emitting element ED_B, which are the same as the description of the red light-emitting element ED_R, may be substantially substituted with that of the red light-emitting element ED_R. Duplicate description may be omitted. The red light-emitting element ED_R may include an organic light-emitting element, a quantum dot light-emitting element, a micro-LED light-emitting element, or a nano-LED light-emitting element. However, the present disclosure is not limited to this, and the red light-emitting element ED_R may include various embodiments as long as light may be generated or the amount of light may be controlled in response to an electrical signal.

The photo-sensing element OPD may be an optical sensor that receives and recognizes light reflected by an external object. For example, the photo-sensing element OPD may be an optical sensor that recognizes light in a visible light band reflected by an external object. According to an embodiment, the photo-sensing element OPD may be a biometric sensor that converts an optical signal into an electrical signal by recognizing light reflected from a user body part, such as a vein, a retina, a ridge or valley in a fingerprint, or the like.

The element layer DP_ED may include a pixel defining layer PDL, and the pixel defining layer PDL may be disposed on the base layer BL. The pixel defining layer PDL is disposed on the circuit layer DP_CL, and a portion of the top surface of the red anode electrode R_AE may be exposed from the opening. The red light-emitting element ED_R and the photo-sensing element OPD may be separated and classified based on the pixel defining layer PDL. The pixel defining layer PDL may be interposed between the first sub-red light-emitting region R_SEA1 and the second sub-red light-emitting region R_SEA2.

According to an embodiment, the pixel defining layer PDL may be formed of a polymer resin. For example, the pixel defining layer (PDL) may be formed by including a polyacrylate-based resin or a polyimide-based resin. In addition, the pixel defining layer PDL may further include an inorganic material in addition to a polymer resin. Moreover, the pixel defining layer PDL may be formed by including a light absorbing material, or may be formed by including a black pigment or a black dye. The pixel defining layer PDL formed by including a black pigment or a black dye may implement a black pixel defining layer. When the pixel defining layer PDL is formed, carbon black may be used as a black pigment or a black dye, but embodiments are not limited thereto.

In addition, the pixel defining layer PDL may be formed of an inorganic material. For example, the pixel defining layer PDL may include silicon nitride (SiNx), silicon oxide (SiOx), silicon oxynitride (SiOxNy), or the like.

Each of the red light-emitting elements ED_R may include a red anode electrode R_AE, a second electrode CE, and a red light-emitting layer R_EL. In the present specification, the red anode electrode R_AE constituting the red light-emitting element ED_R may be referred to as a light-emitting electrode.

The photo-sensing element OPD may include a photo-sensing anode electrode O_AE, a second electrode CE, and a photoelectric conversion layer O_RL. The photo-sensing anode electrode O_AE may be exposed in the opening. The photo-sensing anode electrode O_AE of the element layer DP_ED may include a metal material, a metal alloy, or a conductive compound. The photo-sensing anode O_AE may be an anode or a cathode. However, embodiments are not limited thereto. In addition, the photo-sensing anode electrode O_AE may be a pixel electrode or a sensing electrode. The photo-sensing anode electrode O_AE may be a transmissive electrode, a semi-transmissive electrode, or a reflective electrode. When the photo-sensing anode electrode O_AE is the transmissive electrode, the photo-sensing anode electrode O_AE may include a transparent metal oxide, for example, indium tin oxide (ITO), indium zinc oxide (IZO), zinc oxide (ZnO), and indium tin oxide (ITZO). When the photo-sensing anode electrode O_AE is the semi-transmissive electrode or a reflective electrode, the photo-sensing anode electrode O_AE may include a mixture of Ag, Mg, Cu, Al, Pt, Pd, Au, Ni, Nd, Ir, Cr, Li, Ca, LiF/Ca, LiF/Al, Mo, Ti, and/or a mixture of compounds thereof (for example, the mixture of Ag and Mg).

The second electrode CE may be a common electrode. The second electrode CE may be a cathode or an anode, but is not limited thereto. For example, when the red anode electrode R_AE is an anode, the second electrode CE may be a cathode. When the red anode electrode R_AE is a cathode, the second electrode CE may be an anode.

The second electrode CE may be a transmissive electrode, a semi-transmissive electrode, or a reflective electrode. When the second electrode CE is a transmissive electrode, the second electrode CE may include a transparent metal oxide, for example, indium tin oxide (ITO), indium zinc oxide (IZO), zinc oxide (ZnO), and indium tin oxide (ITZO). When the second electrode CE is a semi-transmissive electrode or a reflective electrode, the second electrode may include a mixture of Ag, Mg, Cu, Al, Pt, Pd, Au, Ni, Nd, Ir, Cr, Li, Ca, LiF/Ca, LiF/Al, Mo, Ti, and/or respective compounds thereof (for example, AgMg, AgYb, or MgAg).

Moreover, the red anode electrode R_AE and the photo-sensing anode electrode O_AE included in the element layer DP_ED according to an embodiment may be a semi-transmissive electrode or a reflective electrode, and the second electrode CE may be a transmissive electrode or a semi-transmissive electrode. Thus, according to an embodiment, as the transmissive or semi-transmissive second electrode CE is included, the light reflected from the external object may be efficiently transmitted to the photo-sensing element OPD.

The red light-emitting layer R_EL of the red light-emitting element ED_R may be interposed between the red anode electrode R_AE and the second electrode CE. The red light-emitting layer R_EL may include an organic light-emitting material or a quantum dot material. The red light-emitting layer R_EL may include a first sub-red light-emitting region R_SEA1 and a second sub-red light-emitting region R_SEA2. The first sub-red light-emitting region R_SEA1 may correspond to the first sub-red light-emitting element ED_SR1 illustrated in FIG. 5A, and the second sub-red light-emitting region R_SEA2 may correspond to the second sub-red light-emitting element ED_SR2.

Moreover, the photo-sensing element OPD may include a photoelectric conversion layer O_RL interposed between a photo-sensing anode electrode O_AE and a second electrode CE. The photoelectric conversion layer O_RL may include a light receiving material for receiving light to convert the light into an electrical signal. For example, according to an embodiment, the photoelectric conversion layer O_RL may include an organic light receiving material. In an embodiment, the photoelectric conversion layer O_RL may include an organic polymer material as a light receiving material. For example, the photo-electric converting layer O_RL may include a conjugated polymer. The photoelectric conversion layer O_RL may include thiophene-based conjugated polymer, benzodithiophene-based conjugated polymer, thieno[3,4-c]pyrrole-4,6-dione (TPD)-based conjugated polymer, diketo-pyrrole-pyrrole (DPP)-based conjugated polymer, orbenzothiadiazole (BT)-based conjugated polymer. However, embodiments are not limited thereto.

The color filter layer CFL may include filter parts CF and light blocking parts BM. The filter parts CF may include a red filter part, a green filter part, and a blue filter part. The red filter part, the green filter part, and the blue filter part may be parts positioned to correspond to the red light-emitting region, the green light-emitting region, and the blue light-emitting region. The green filter part may be overlapped with the first green light-emitting element ED_G1 and the photo-sensing element OPD.

The filter parts CF may transmit red light, green light, and blue light. The filter parts CF may include a polymer photosensitive resin and a pigment or a dye.

The light blocking part BM may be disposed on the input sensing layer ISL and may overlap the boundary between adjacent filter parts CF. The light blocking part BM may prevent light leakage and may identify the boundary between adjacent color filter parts CF.

The light blocking part BM may be a black matrix. The light blocking part BM may include an organic pigment or dye. The light blocking part BM may be formed to include an organic light blocking material or an inorganic light blocking material, which includes a black pigment or a black dye. The light blocking part BM may be formed based on a light blocking composition including propylene glycol monomethyl ether acetate, 3-methoxybutyl acetate, and an organic black pigment.

The light blocking part BM may be overlapped with the pixel defining layer PDL. The pixel defining layer PDL may be disposed to be overlapped with the pixel defining layer PDL interposed between the first sub-red light-emitting region R_SEA1 and the second sub-red light-emitting region R_SEA2.

The color filter layer CFL may further include an over-coating layer OCL. The over-coating layer OCL may include an organic insulating material. The over-coating layer OCL may be provided to have a thickness sufficient to remove a step difference between the filter parts CF. The over coating layer OCL may include, for example, an acrylate-based organic material, as long as the over coating layer OCL has a specific thickness and planarizes a top surface of the color filter layer CFL.

The circuit layer DP_CL may be connected to the element layer DP_ED to drive the red light-emitting element ED_R and the photo-sensing element OPD of the element layer DP_ED. The circuit layer DP_CL may include a red pixel driving circuit R_PD and a sensor driving circuit O_SD. The red light-emitting element ED_R and the red pixel driving circuit R_PD may constitute a red pixel PXR, and the photo-sensing element OPD and the sensor driving circuit O_SD may constitute a sensor FX.

The red pixel driving circuit R_PD may be electrically connected to the red light-emitting element ED_R and may be connected to the red light-emitting element ED_R one-to-one. In other words, one red pixel driving circuit R_PD is connected to one red light-emitting element ED_R. The red light-emitting element ED_R may include sub-red light-emitting elements ED_SR1 and ED_SR2, and the red pixel driving circuit R_PD may be connected to the sub-red light-emitting elements ED_SR1 and ED_SR2, respectively. The red light-emitting element ED_R may be an organic light-emitting diode.

The sensor driving circuit O_SD may be electrically connected to the photo-sensing element OPD to be connected to one photo-sensing element OPD. In other words, one sensor driving circuit O_SD and one photo-sensing element OPD are connected to each other. In this case, the photo-sensing element OPD may include an organic photodiode. According to an embodiment, at least two (n number of) photo-sensing elements OPDs may be connected to one sensor driving circuit O_SD.

A plurality of red pixel driving circuits R_PD may be provided to correspond to the number of red light-emitting elements ED_R. A plurality of sensor driving circuits O_SD may be provided to correspond to the number of photo-sensing elements OPD. The circuit layer DP_CL may provide a limited space in which a plurality of pixel driving parts PDCs and a plurality of sensor driving parts SDCs are disposed.

Figure 6A:
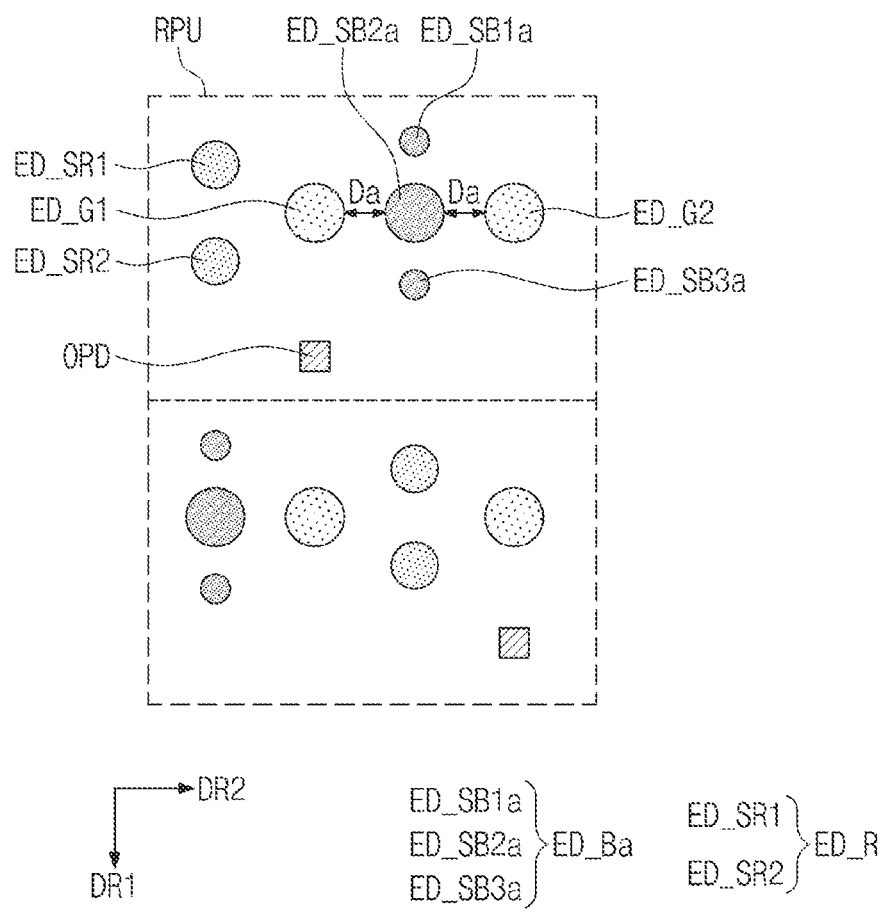
FIG. 6A is a plan view diagram illustrating a portion of a display panel according to an embodiment of the present disclosure.
Figure 6B:
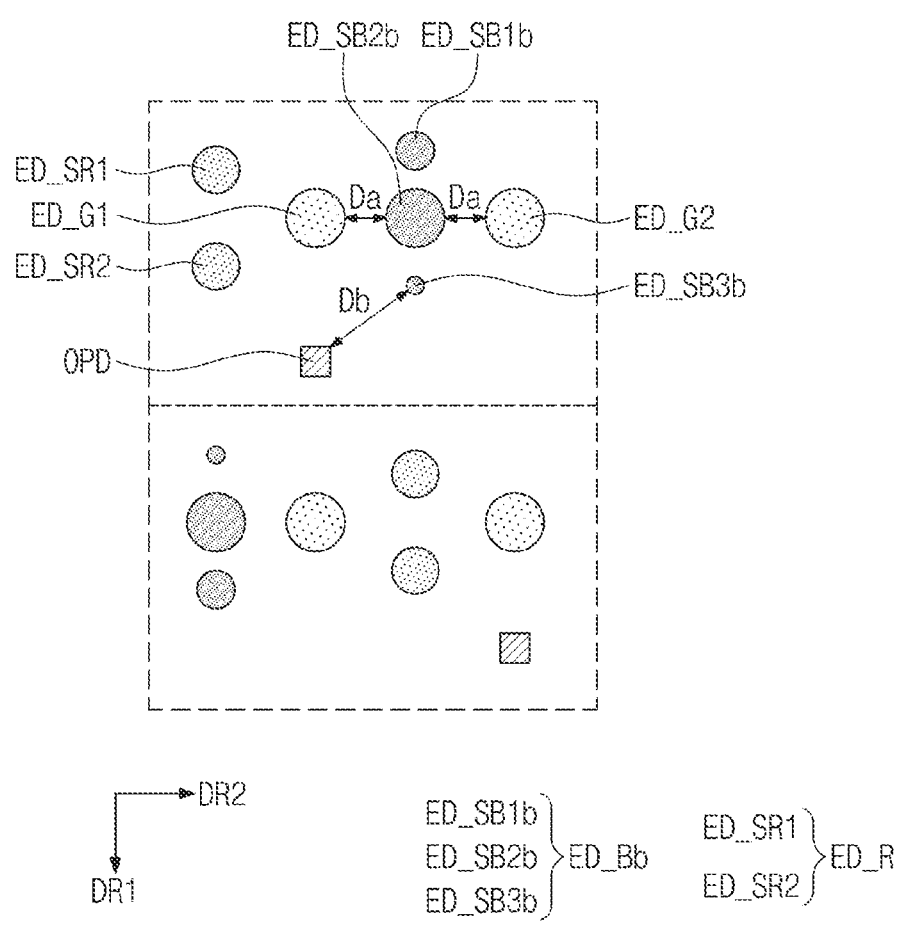
FIG. 6B is an exploded plan view diagram illustrating a partial region of a display panel according to an embodiment of the present disclosure.
Figure 6C:
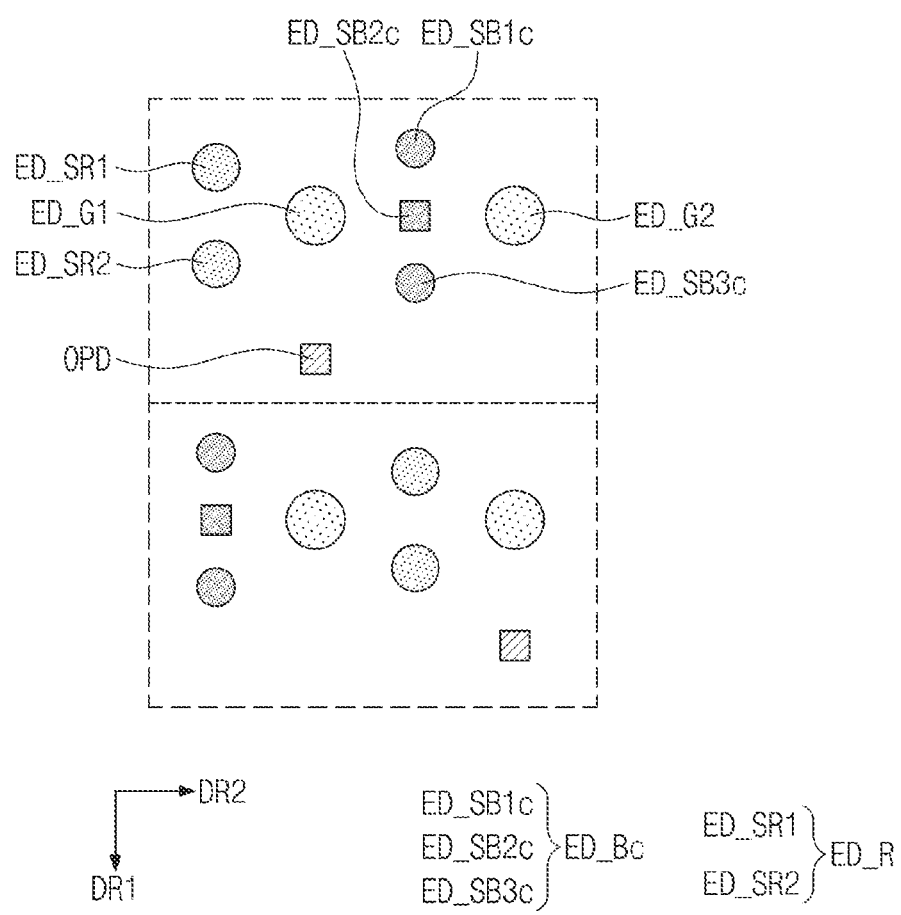
FIG. 6C is an exploded view diagram illustrating a partial region of a display panel according to an embodiment of the present disclosure.

FIGS. 6A to 6C are enlarged plan views of a partial region of a display panel according to an embodiment of the present disclosure. However, the same reference numerals are assigned to the same components as those illustrated in FIG. 5A of the components illustrated in FIGS. 6A to 6C, and the details thereof will be omitted to avoid redundancy.

Referring to FIG. 6A, the blue light-emitting elements ED_Ba may include a first sub-blue light-emitting element ED_SB1a, a second sub-blue light-emitting element ED_SB2a, and a third sub-blue light-emitting element ED_SB3a. Each of the first sub-blue light-emitting element ED_SB1a, the second sub-blue light-emitting element ED_SB2a, and the third sub-blue light-emitting element ED_SB3a may have a circular shape, but the present disclosure is not limited thereto The sum of the regions of the first sub-red light-emitting element ED_SB1a, the second sub-blue light-emitting element ED_SB2a, and the third sub-blue light-emitting element ED_SB3a may be defined to the region of the blue light-emitting element ED_B.

According to an embodiment, the first sub-blue light-emitting element ED_SB1a and the third sub-blue light-emitting element ED_SB3a may have different sizes from the second sub-blue light-emitting element ED_SB2a. In this case, the first sub-blue light-emitting element ED_SB1a and the third sub-blue light-emitting element ED_SB3a may be defined as outermost light-emitting elements, and the second sub-blue light-emitting element ED_SB2a may be defined as a central light-emitting element. The first sub-blue light-emitting element ED_SB1a and the third sub-blue light-emitting element ED_SB3a may have the same size and the same shape. The first sub-blue light-emitting element ED_SB1a and the third sub-blue light-emitting element ED_SB3a may have a circular shape smaller than the second sub-blue light-emitting element ED_SB2a. As the outermost light-emitting element (that is, the first sub-blue light-emitting element (ED_SB1a) and the third sub-blue light-emitting element (ED_SB3a)) is formed smaller than the central light-emitting element (that is, the second sub-blue light-emitting element (ED_SB2a)), the space for disposing the photo-sensing element OPD is sufficiently ensured, such that the area in a plan view of the photo-sensing element OPD may be increased.

The sum of the areas of the first sub-blue light-emitting element ED_SB1a, the second sub-blue light-emitting element ED_SB2a, and the third sub-blue light-emitting element ED_SB3a may be the same as the areas of the first sub-blue light-emitting element ED_SB1, the second sub-blue light-emitting element ED_SB2, and the third sub-blue light-emitting element ED_SB3a illustrated in FIG. 5. In other words, in the state in which the total area of the blue light-emitting element ED_Ba is not changed, the size of the sub-blue light-emitting element ED_SB2a may be increased by the sizes of the blue light-emitting element ED_SB1a and the third sub-blue light-emitting element ED_SB3a, which are reduced, such that the sizes of the blue light-emitting element ED_SB1a and the third sub-blue light-emitting element ED_SB3a are reduced. According to an embodiment of the present disclosure, the size of the second sub-blue light-emitting element ED_SB2a may be larger than that of the sub-red light-emitting elements ED_SR1 and ED_SR2, and may be the same as or smaller than the first and second green light-emitting elements ED_G1 and ED_G2. The second sub-blue light-emitting element ED_SB2a is spaced apart from the first and second green light-emitting elements ED_G1 and ED_G2 adjacent to the second sub-blue light-emitting element ED_SB2a by a specific distance Da. The distance Da may be maintained to be a specific distance (for example, about 16.5 μm) or more to prevent light (for example, blue light and green light), which is output from each light-emitting element, from interfering with each other.

Referring to FIG. 6B, the blue light-emitting element ED_Bb may include a first sub-blue light-emitting element ED_SB1 b, a second sub-blue light-emitting element ED_SB2b, and a third sub-blue light-emitting element ED_SB3b. Each of the first sub-blue light-emitting element ED_SB1 b, the second sub-blue light-emitting element ED_SB2b, and the third sub-blue light-emitting element ED_SB3b may have the same shape (for example, a circular shape), but the present disclosure is not limited thereto Accordingly, the first sub-blue light-emitting element ED_SB1 b, the second sub-blue light-emitting element ED_SB2b, and the third sub-blue light-emitting element ED_SB3b may have mutually different sizes. According to an embodiment of the present disclosure, the third sub-blue light-emitting element ED_SB3b may have a size smaller than sizes of the first sub-blue light-emitting element ED_SB1 b, and the second sub-blue light-emitting element ED_SB2b. As the third sub-blue light-emitting element ED_SB3b is formed to be smaller than the first sub-blue light-emitting element ED_SB1 b, the space for disposing the photo-sensing element OPD is sufficiently ensured, such that the area in a plan view of the photo-sensing element OPD may be increased.

The sum of the areas of the first sub-blue light-emitting element ED_SB1 b, the second sub-blue light-emitting element ED_SB2b, and the third sub-blue light-emitting element ED_SB3b may be equal to the sum of areas of the first sub-blue light-emitting element ED_SB1, the second sub-blue light-emitting element ED_SB2, and the third sub-blue light-emitting element ED_SB3 illustrated in FIG. 5A. In other words, the size of the second sub-blue light-emitting element ED_SB2b may be increased by the size of the third sub-blue light-emitting element ED_SB3b decreased, such that the size of the third sub-blue light-emitting element ED_SB3b is reduced, in a state where the total area of the blue light-emitting element ED_Bd is not changed. According to an embodiment of the present disclosure, the size of the second sub-blue light-emitting element ED_SB2b may be greater than that of the sub-red light-emitting elements ED_SR1 and ED_SR2, and may be greater than or smaller than that of the first and second green light-emitting elements ED_G1 and ED_G2.

The third sub-blue light-emitting element ED_SB3b is spaced apart from the photo-sensing element OPD adjacent thereto by a specific distance Db. According to an embodiment of the present disclosure, as the size of the third sub-blue light-emitting element ED_SB3b is decreased, the distance Db between the third sub-blue light-emitting element ED_SB3b and the photo-sensing element OPD is increased, such that the maximum area of the photo-sensing element OPD may be ensured.

Referring to FIG. 6C, the blue light-emitting elements ED_Bc may include a first sub-blue light-emitting element ED_SB1c, a second sub-blue light-emitting element ED_SB2c, and a third sub-blue light-emitting element ED_SB3c. In this case, the first sub-blue light-emitting element ED_SB1c and the third sub-blue light-emitting element ED_SB3c may be defined as outermost light-emitting elements, and the second sub-blue light-emitting element ED_SB2c may be defined as a central light-emitting element.

The outermost light-emitting element may have a shape different from that of the central light-emitting element. According to an embodiment of the present disclosure, the second sub-blue light-emitting element ED_SB2c may have the shape the same as those of the first sub-blue light-emitting element ED_SB1c, and the third sub-blue light-emitting element ED_SB3c. For example, the second sub-blue light-emitting element ED_SB2c may have a rectangular shape. Although FIG. 6C illustrates that the second sub-blue light-emitting element ED_SB2c has a square shape having the same length in the first direction DR1 and the second direction DR2, the present disclosure is not limited thereto. The second sub-blue light-emitting element ED_SB2c may have a rectangular shape, a rounded edge, or an octagonal shape longer in the first direction DR1 than in the second direction DR2.

According to an embodiment of the present disclosure, the first sub-blue light-emitting element ED_SB1c and the third sub-blue light-emitting element ED_SB3c may have the same shape and an equal size. However, the present disclosure is not limited thereto. Alternatively, the first sub-blue light-emitting element ED_SB1c and the third sub-blue light-emitting element ED_SB3c may have different shapes and different sizes.

Figure 7A:
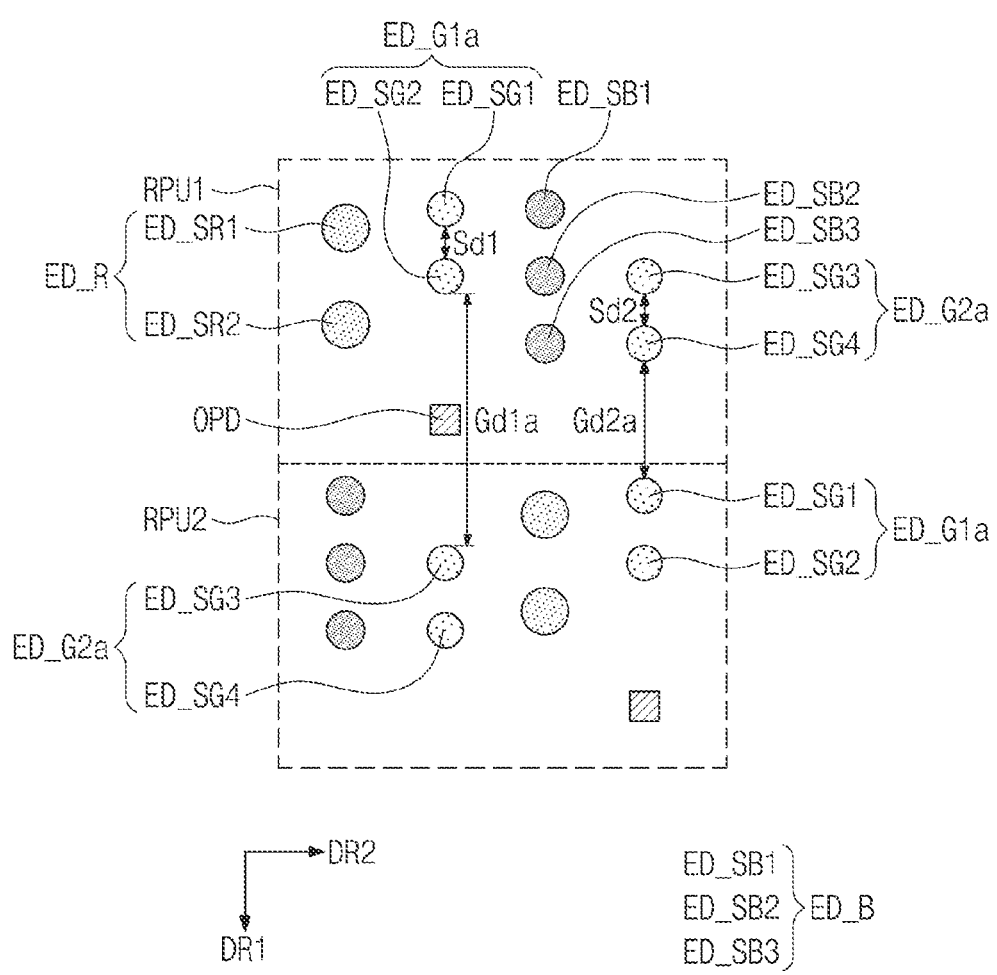
FIG. 7A is an enlarged plan view diagram illustrating a partial region of a display panel according to an embodiment of the present disclosure.
Figure 7B:
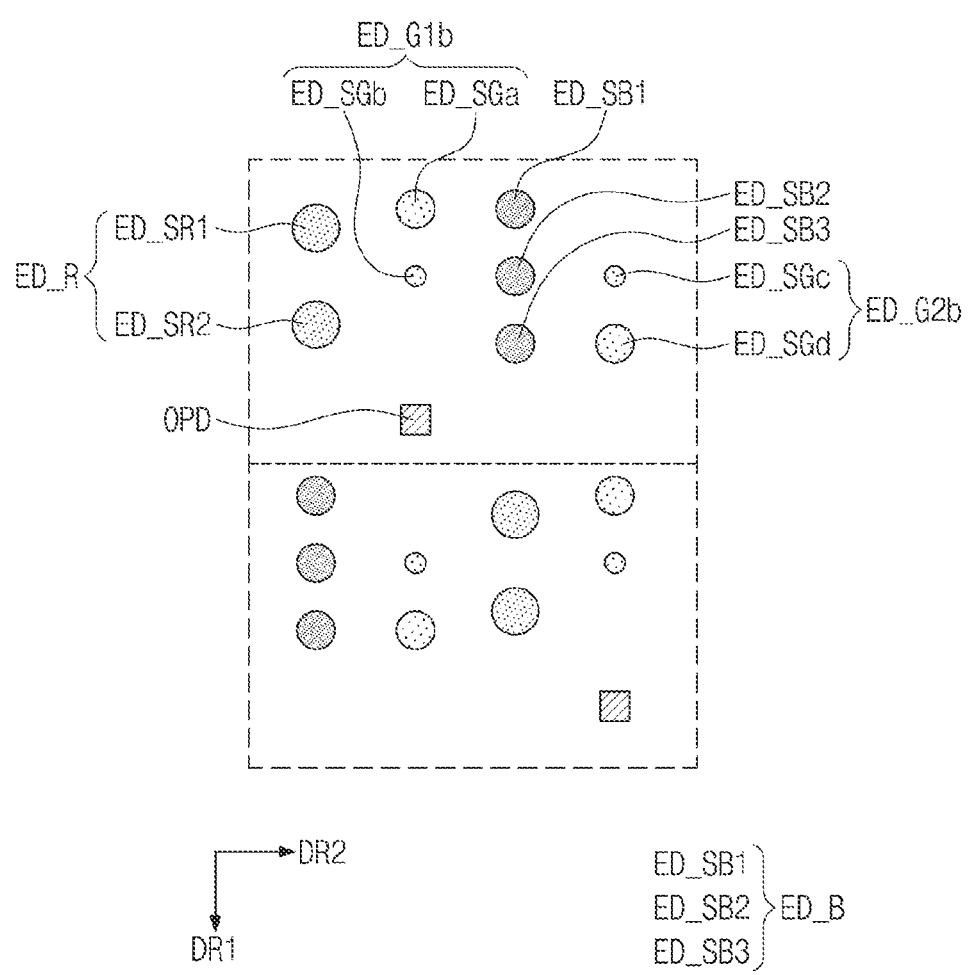
FIG. 7B is a plan view diagram illustrating a partial region of a display panel according to an embodiment of the present disclosure.

FIGS. 7A, 7B, and 7C are enlarged plan views of a partial area of a display panel according to embodiments of the present disclosure. However, the same reference numerals are assigned to the same components as those illustrated in FIG. 5A of the components illustrated in FIGS. 7A, 7B, and 7C, and the details thereof will be omitted to avoid redundancy.

Referring to FIG. 7A, the first green light-emitting elements ED_G1a may include the first sub-green light-emitting element ED_SG1 and the second sub-green light-emitting element ED_SG2, and the second green light-emitting element ED_G2a may include the third sub-green light-emitting element ED_SG3 and the fourth sub-green light-emitting element ED_SG4. Each of the first to fourth sub-green light-emitting elements ED_SG1, ED_SG2, ED_SG3, and ED_SG4 may have a circular shape, but the present disclosure is not limited thereto.

The sub-green light-emitting elements of the present embodiment may emit substantially the same wavelengths of light. In an alternate embodiment, at least one of the sub-green light-emitting elements may be configured to emit a slightly different wavelength of light to address at least one human color vision anomaly.

The sub-green light-emitting elements ED_SG1, ED_SG2, ED_SG3, and ED_SG4 may have the same size and the same shape. The distance Sd1 (hereinafter referred to as the first sub-interval Sd1) between the first sub-green light-emitting element ED_SG1 and the second sub-green light-emitting element ED_SG2, may be equal to the distance Sd2 (hereinafter, the second sub-distance Sd2) the third sub-green light-emitting element ED_SG3 and the fourth sub-green light-emitting element ED_SG4. However, the present disclosure is not limited thereto. For example, the first distance Sd1 and the second distance Sd2 may have mutually different sizes. The first and second sub-spaces Sd1 and Sd2 may be freely determined within a minimum process interval range of, for example, about 5 μm to about 6.5 μm.

According to an embodiment, the first sub-green light-emitting element ED_SG1 and the second sub-green light-emitting element ED_SG2 may be arranged in a row in the first direction DR1. The third sub-green light-emitting element ED_SG3 and the fourth sub-green light-emitting element ED_SG4 which are included in the second reference pixel unit RPU2 adjacent to the first reference pixel unit RPU1 in the first direction DR1 may be aligned in a line with each other in the first direction DR1. According to an embodiment of the present disclosure, the first sub-green light-emitting element ED_SG1 and the second sub-green light-emitting element ED_SG2 in the first reference pixel unit RPU1 may be aligned in a line with the third sub-green light-emitting element ED_SG3 and the fourth sub-green light-emitting element ED_SG4 in the second reference pixel unit RPU2 when viewed in the first direction DR1.

In the first reference pixel unit RPU1, the third sub-green light-emitting element ED_SG3 and the fourth sub-green light-emitting element ED_SG4 may be aligned in a line with each other in the first direction DR1. The first sub-green light-emitting element ED_SG1 and the second sub-green light-emitting element ED_SG2 included in the second reference pixel unit RPU2 may be aligned in a line with each other, when viewed in the first direction DR1. According to an embodiment of the present disclosure, the third sub-green light-emitting element ED_SG3 and the fourth sub-green light-emitting element ED_SG4 in the first reference pixel unit RPU1 may be aligned in a line with the first sub-green light-emitting element ED_SG1 and the second sub-green light-emitting element ED_SG2 included in the second reference pixel unit RPU2, when viewed in the first direction DR1.

According to an embodiment, the photo-sensing element OPD may be interposed between the second sub-green light-emitting element ED_SG2 of the first reference pixel unit RPU1 and the third sub-light-emitting element ED_SG3 of the second reference pixel unit RPU2 when viewed in the first direction DR1. Moreover, the photo-sensing element OPD need not be interposed between the fourth sub-green light-emitting element ED_SG4 of the first reference pixel unit RPU1 and the first sub-light-emitting element ED_SG1 of the second reference pixel unit RPU2. Accordingly, the fifth distance Gd1a between the second sub-green light-emitting element ED_SG2 in the first reference pixel unit RPU1 and the third sub-green light-emitting element ED_SG3 in the second reference pixel unit RPU2 may be greater than the sixth distance Gd2a between the fourth sub-green light-emitting element ED_SG4 in the first reference pixel RPU2 and the first sub-green light-emitting element ED_SG1 in the second reference pixel unit RPU2.

As the fifth distance Gd1a is greater than the sixth distance Gd2a, a sufficient space for disposing the photo-sensing element OPD is ensured, thereby increasing the area of the photo-sensing element OPD.

Referring to FIG. 7B, in the first green light-emitting element ED_G1 b, the first sub-green light-emitting element ED_SGa and the second sub-green light-emitting element ED_SGb may have different sizes. According to an embodiment of the present disclosure, the second sub-green light-emitting element ED_SGb may have the shape of a circle smaller than the shape of a circle of the first sub-green light-emitting element ED_SGa. As the second sub-green light-emitting element ED_SGb has a size smaller than that of the first sub-green light-emitting element ED_SGa, a sufficient space for disposing the photo-sensitive device OPD is secured, such that the area in a plan view of the photo-sensitive device OPD may be increased.

Accordingly, the third sub-green light-emitting element ED_SGc and the fourth sub-green light-emitting element ED_SGd in the second green light-emitting element ED_G2b may have mutually different sizes. According to an embodiment of the present disclosure, the third sub-green light-emitting element ED_SGc may have the shape of a circle smaller than that of the fourth sub-green light-emitting element ED_SGd.

According to an embodiment of the present disclosure, the size and shape of the first sub-green light-emitting element ED_SGa may be the same as the size and shape of the fourth sub-green light-emitting element ED_SGd, and the size and shape of the second sub-green light-emitting element ED_SGc may be the same. However, the present disclosure is not limited thereto, and the sizes and shapes of the first to the fourth sub-green light-emitting elements ED_SGa, ED_SGb, ED_SGc, and ED_SGd may be different from each other.

Figure 8:
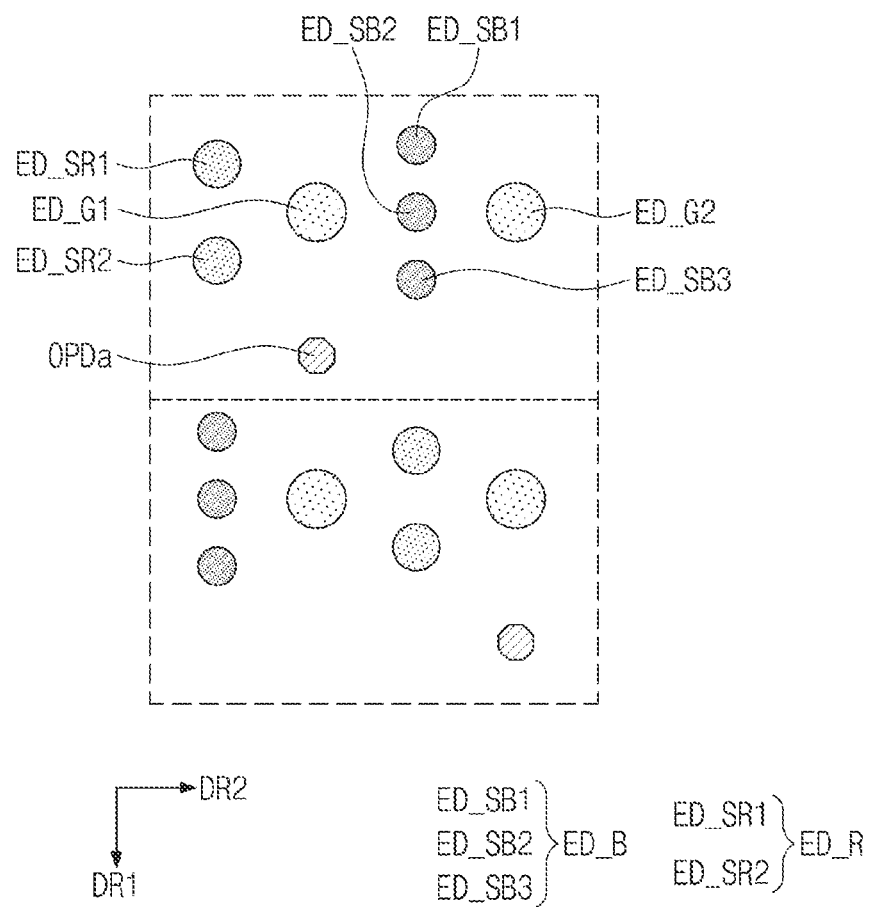
FIG. 8 is a plan view diagram illustrating a partial region of a display panel according to an embodiment of the present disclosure.

FIG. 8 shows an enlarged plan view of a partial region of a display panel according to an embodiment of the present disclosure. However, the same reference numerals are assigned to the same components as those illustrated in FIG. 5A of the components illustrated in FIG. 8, and the details thereof will be omitted to avoid redundancy.

Referring to FIG. 8, when compared to the photo-sensing element OPD illustrated in FIG. 5A, the photo-sensing element OPDa may have an octagonal shape. Although FIG. 8 illustrates an octagonal shape in which the sides of the photo-sensing element OPDa have the same length, the photo-sensing element OPDa may have a rectangular shape longer in the first direction DR1 than in the second direction DR2. In other words, the shape of the photo-sensing element OPDa may be variously changed within a range in which a minimum process distance to the adjacent light-emitting elements is maintained. In addition, as the shape of the photo-sensing element OPDa is adjusted to be different from that of the light-emitting elements (for example, red and blue light-emitting elements ED_R and ED_B), the distance between the photo-sensing element OPDa and the adjacent light-emitting elements ED_R, ED_G1, ED_G2, and ED_B may be ensured to be the minimum process distance or more. Therefore, the size of the photo-sensing element OPDa may be prevented from being decreased due to process limitations, and the process reliability of the display panel DP may be optimized without degrading the performance of the sensor FX or the resolution of the display panel DP.

Figure 9A:
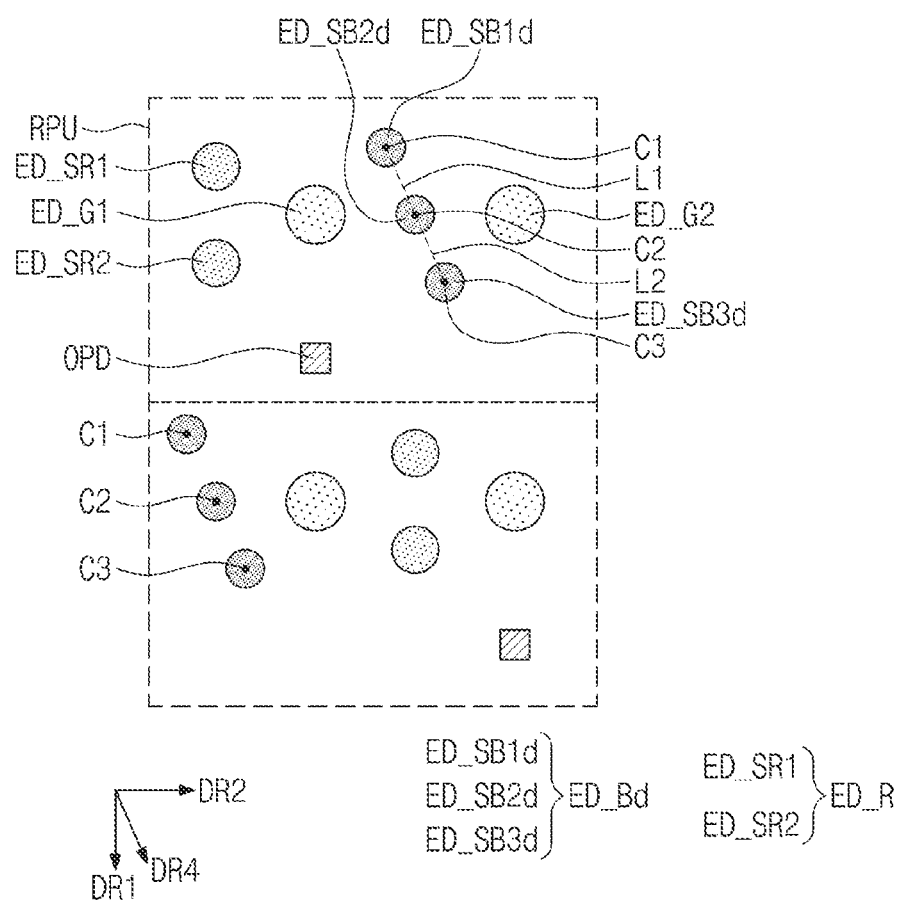
FIG. 9A is an enlarged plan view diagram illustrating a partial region of a display panel according to an embodiment of the present disclosure.
Figure 9B:
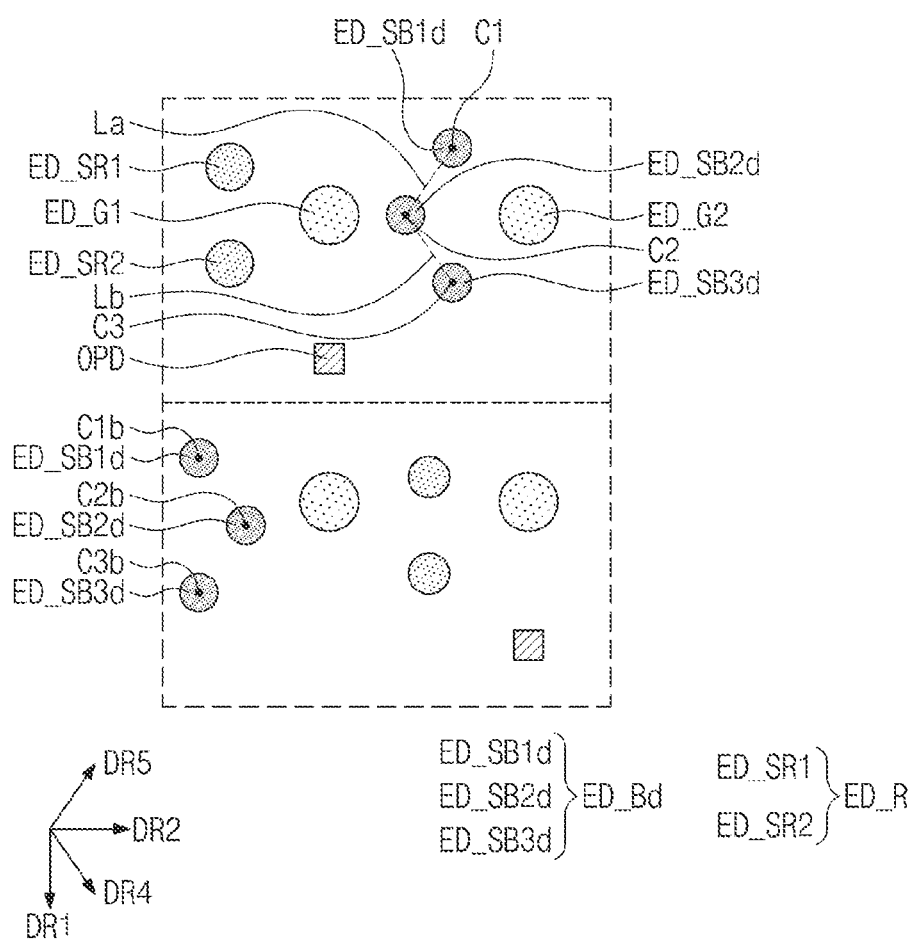
FIG. 9B is a plan view diagram illustrating a partial region of a display panel according to an embodiment of the present disclosure.
Figure 9C:
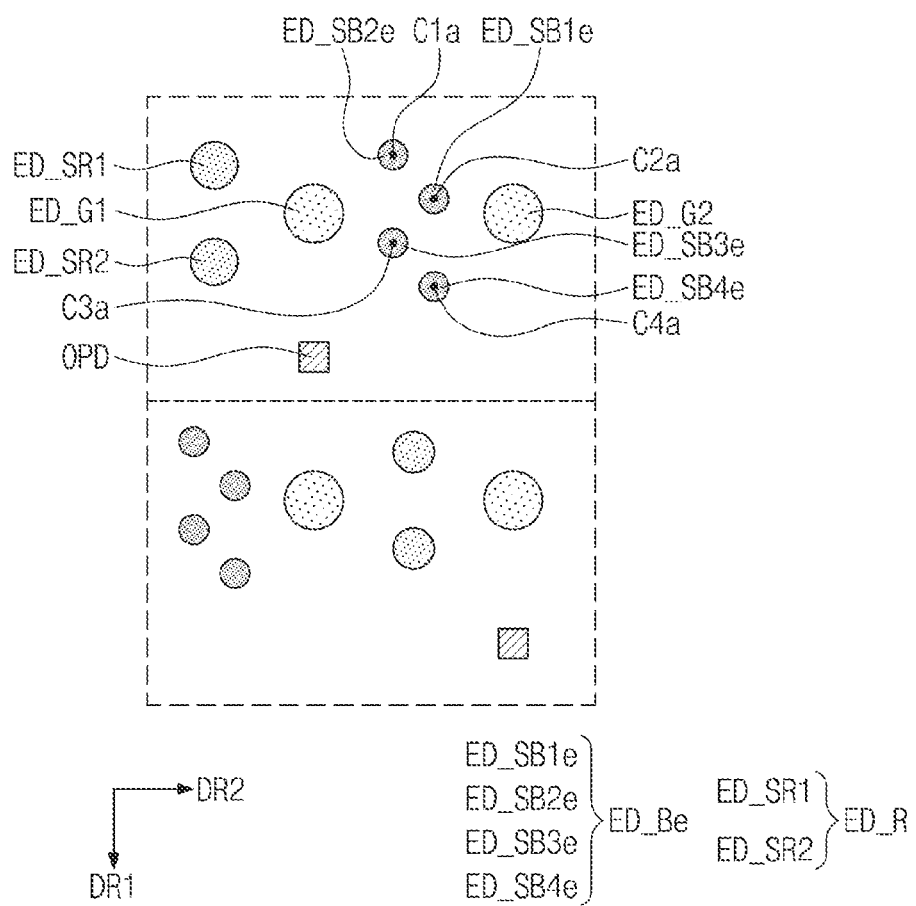
FIG. 9C is a plan view diagram illustrating a partial region of a display panel, according to an embodiment of the present disclosure.

FIGS. 9A to 9C are plan views in which a partial area of a display panel is enlarged according to embodiments of the present disclosure.

Referring to FIG. 9A, the blue light-emitting elements ED_Bd may include a first sub-blue light-emitting element ED_SB1d, a second sub-blue light-emitting element ED_SB2d, and a third sub-blue light-emitting element ED_SB3d. Each of the first sub-blue light-emitting element ED_SB1d, the second sub-blue light-emitting element ED_SB2d, and the third sub-blue light-emitting element ED_SB3d may have a circular shape, but the present disclosure is not limited thereto The centers of the first sub-blue light-emitting element ED_SB1d, the second sub-blue light-emitting element ED_SB2d, and the third sub-blue light-emitting element ED_SB3d may be defined as a first center C1, a second center C2, and a third center C3, respectively. The first center C1, the second center C2, and the third center C3 need not be aligned in the first direction DR1. As illustrated in FIG. 5A, a structure in which the first to third sub-blue light-emitting elements ED_SB1, ED_SB2, and ED_SB3 are aligned in the first direction DR1 may be referred to as a first alignment structure.

According to an embodiment, the first center C1, the second center C2, and the third center C3 may be aligned in the fourth direction DR4 inclined with respect to the first direction DR1. Hereinafter, a structure in which the first to third sub-blue light-emitting elements ED_SB1d, ED_SB2d, and ED_SB3d are aligned in the fourth direction DR4 may be referred to as a second alignment structure The first virtual line L1 for connecting the first center C1 to the second center C2 and the second virtual line L2 for connecting the second center C2 to the third center C3 may be parallel to the fourth direction DR4. However, the present disclosure is not limited thereto. As illustrated in FIG. 9B, the first and second virtual lines La and Lb need not be parallel to each other. The first virtual line La may be parallel to the fifth direction DR5, and the second virtual line Lb may be parallel to the fourth direction DR4 crossing the fifth direction DR5.

The first to third sub-blue light-emitting elements ED_SB1d, ED_SB2d, and ED_SB3d included in each reference pixel unit RPU may have the second alignment structure. As illustrated in FIGS. 9A and 9B, since the first to third sub-blue light-emitting elements ED_SB1d, ED_SB2d, and ED_SB3d have a second alignment structure, a sufficient space for disposing the photo-sensing element OPD is ensured, thereby increasing an area in a plan view of the photo-sensing element OPD.

Referring to FIG. 9C, the blue light-emitting elements ED_Be may include a first sub-blue light-emitting element ED_SB1e, a second sub-blue light-emitting element ED_SB2e, a third sub-blue light-emitting element ED_SB3e, and a fourth sub-blue light-emitting element ED_SB4e. Each of the first sub-blue light-emitting element ED_SB1e, the second sub-blue light-emitting element ED_SB3e, and the third sub-blue light-emitting element ED_SB4e may have a circular shape, but the present disclosure is not limited thereto The centers of the first sub-blue light-emitting element ED_SB1e, the second sub-blue light-emitting element ED_SB2e, the third sub-blue light-emitting element ED_SB3e, and the fourth sub-blue light-emitting element ED_SB4e may be defined as a first center C1a, a second center C2a, and a third center C3a, and a fourth center C4a, respectively.

According to an embodiment, the first to fourth centers C1a to C4a may be arranged in a zigzag form. The first center C1a and the third center C3a may be aligned in the first direction DR1, and the second center C2a and the fourth center C4a may be aligned in the first direction DR1. The second center C2a and the fourth center C4a may be disposed to be more biased in the second direction DR2 than the first center C1a and the third center C3a are biased in the second direction DR2. However, the present disclosure is not limited thereto, and each of the first center C1a, the second center C2a, the third center C3a, and the fourth center C4a need not be aligned in the first direction DR1.

When compared to FIG. 9A, as the blue light-emitting elements ED_Be further includes a fourth sub-blue light-emitting element ED_SB4e, the sizes of the first sub-blue light-emitting element ED_SB1e, the second sub-blue light-emitting element ED_SB2e, the third sub-blue light-emitting element ED_SB3e, and the fourth sub-blue light-emitting element ED_SB4e are smaller than the sizes of the sub-blue light-emitting elements ED_SB1d, ED_SB2d, and ED_SB3d in FIG. 9A, and the distance between the first sub-blue light-emitting element ED_SB1e, the second sub-blue light-emitting element ED_SB2e, the third sub-blue light-emitting element ED_SB3e, and the fourth sub-blue light-emitting element ED_SB4e may be shorter than the distance between the sub-blue light-emitting elements ED_SB1d, ED_SB2d, and ED_SB3d.

As illustrated in FIG. 9C, a structure in which the first to fourth centers C1a to C4a are arranged in a zigzag form may be referred to as a third alignment structure. The first sub-blue light-emitting element ED_SB1e, the second sub-blue light-emitting element ED_SB2e, the third sub-blue light-emitting element ED_SB3e, and the fourth sub-blue light-emitting element ED_SB4e included in each reference pixel unit RPU may have the third alignment structure. As illustrated in FIG. 9C, as the first sub-blue light-emitting element ED_SB1e, the second sub-blue light-emitting element ED_SB2e, the third sub-blue light-emitting element ED_SB3e, and the fourth sub-blue light-emitting element ED_SB4e may have the third alignment structure, a sufficient space for disposing the photo-sensitive device OPD is ensured. Accordingly, the area in a plan view of the photo-sensing element OPD may be increased.

Figure 10:
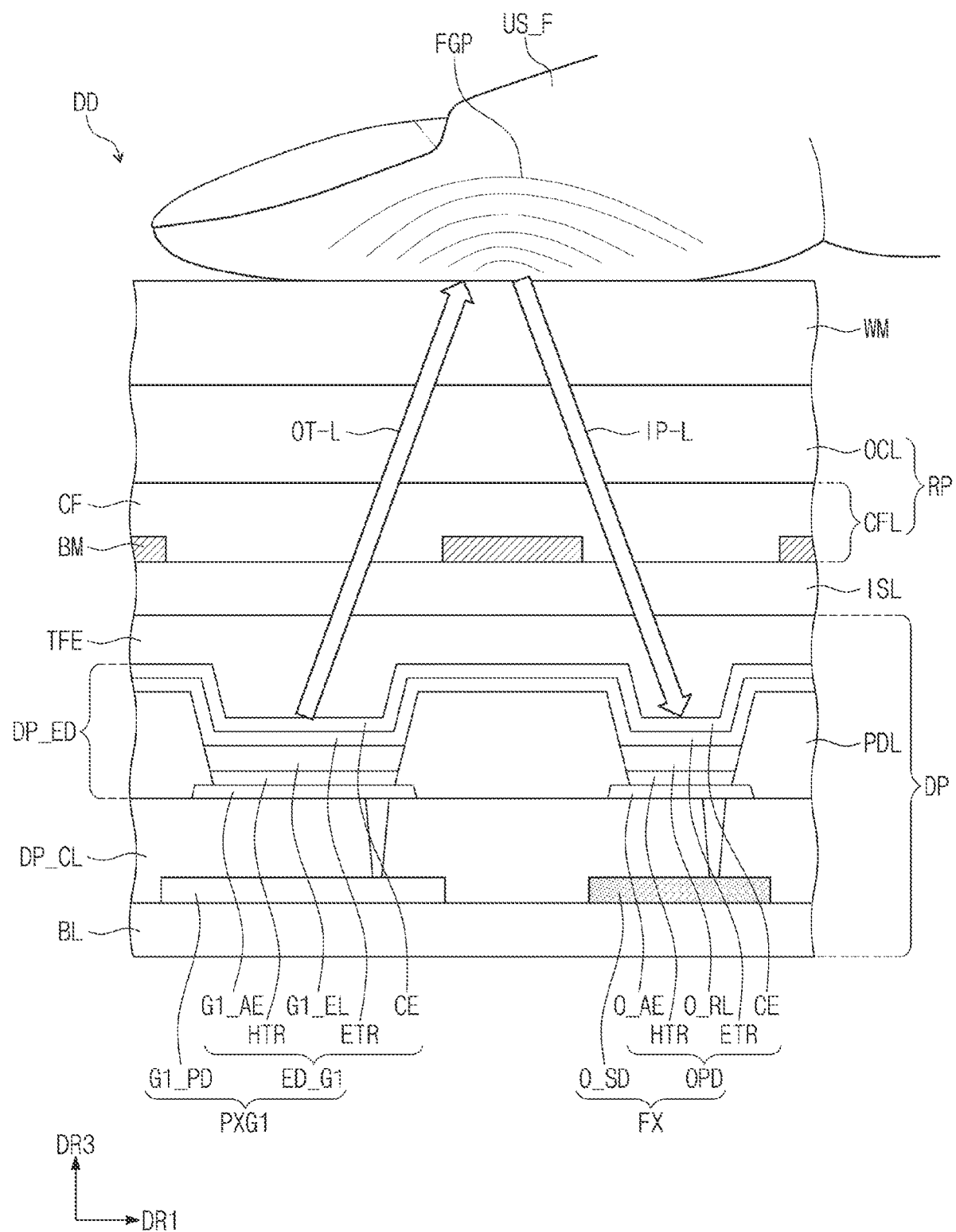
FIG. 10 is a cross-sectional view diagram of a display device according to an embodiment of the present disclosure.

FIG. 10 is a perspective view of a display device according to an embodiment of the present disclosure. FIG. 10 illustrates a state in which a fingerprint FGP that is one of biometric information input through a user hand US_F is recognized. Hereinafter, redundant descriptions will be omitted.

Referring to FIG. 10, light OT-L emitted from the green first green light-emitting element ED_G1 included in the element layer DP_ED in the display device DD according to an embodiment may be incident to an external object (for example, light reflected from the fingerprint FGP may be incident to the photo-sensing element OPD included in the element layer DP_ED in the form of reflected light IP-L), according to an embodiment. The reflected light IP-L incident to the photo-sensing element OPD may be light in a visible light region. The photo-sensing element OPD may receive incident light and convert the incident light into an electrical signal to recognize an external input and change the driving state of the display device DD.

The element layer DP_ED may be disposed on the circuit layer DP_CL The element layer DP_ED may include light-emitting elements ED_R, ED_G1, ED_G2, and ED_B (see FIG. 5A), and a photo-sensing element OPD. FIG. 10 representatively illustrates the first green light-emitting element ED_G1. The description of the red light-emitting element ED_R, the second green light-emitting element ED_G2, and the blue light-emitting element ED_B, which are the same as the description of the first light-emitting element ED_G1, may be substituted with the first green light-emitting element ED_G1. The element layer DP_ED includes a pixel defining layer PDL, and the first green light-emitting element ED_G1 and the photo-sensing element OPD may be separated from each other based on the pixel defining layer PDL. Each of the first green light-emitting elements ED_G1 may include a first electrode G1_AE, a second electrode CE, and a light-emitting layer G1_EL (the same as the first green light-emitting layer of FIG. 5B). The photo-sensing element OPD may include a first electrode G1_AE, a second electrode CE, and a photoelectric conversion layer O_RL. Each of the first green light-emitting elements ED_G1 may include a hole transport region HTR and an electron transport region ETR. The hole transport region HTR may be disposed between the first electrode G1_AE and the light-emitting layer G1_EL, and the electron transport region ETR may be disposed between the light-emitting layer G1_EL and the second electrode CE. The photo-sensing element OPD may include a hole transport region HTR and an electron transport region ETR. The hole transport region HTR may be disposed between the first electrode G1_AE and the photoelectric conversion layer O_RL, and the electron transport region ETR may be disposed between the photoelectric conversion layer O_RL and the second electrode CE. According to an embodiment, the hole transport region HTR constituting the first green light-emitting element ED_G1 and the photo-sensing element OPD may have a multilayer structure having a single layer including a single material, a single layer including multiple different materials, or a plurality of layers including different materials. For example, the hole transport region HTR may have a single layer structure of a hole injection layer or a hole transport layer, or may have a single layer structure of a hole injection material and a hole transport material. an embodiment, the hole transport region HTR included in the first green light-emitting element ED_G1 and the photo-sensing element OPD may include a hole transport layer and may further include a hole injection layer.

In addition, according to an embodiment, the electron transport region ETR constituting the first green light-emitting element ED_G1 and the photo-sensing element OPD may have a multilayer structure including a single layer formed of a single material, a single layer including a plurality of different materials, and a plurality of layers including a plurality of different materials.

For example, the electron transport region ETR may have a single layer structure of an electron injection layer or an electron transport layer, or a single layer structure including an electron injection material and an electron transport material. In addition, the electron transport region ETR may have a single layer structure including multiple different materials or may further include multiple layers stacked sequentially from the light-emitting layer G1_EL. According to an embodiment, the electron transport region ETR included in the first green light-emitting element ED_G1 and the photo-sensing element OPD may include an electron transport layer and may further include an electron injection layer.

Referring to FIG. 10, according to an embodiment, the hole transport region HTR may be disposed on the light-emitting layer G1_EL of each first green light-emitting element ED_G1 or the photoelectric conversion layer O_RL of the photo-sensing element OPD, and may be divided and provided by the pixel defining layer PDL. In addition, according to an embodiment, the electron transport region ETR may be provided in the form of one common layer. The electron transport region ETR may be provided in the form of a common layer throughout the first green light-emitting element ED_G1 and the photo-sensing element OPD. The electron transport region ETR may be overlapped with the entire portion of the pixel defining layer PDL, the light-emitting layer G1_EL, and the photoelectric conversion layer O_RL.

According to an embodiment of the present disclosure, the light-emitting element included in each pixel is disposed while including the plurality of sub-light-emitting elements divided into each other. Accordingly, the area and the number of the photo-sensing elements included in each sensor may be increased. Accordingly, the sensing performance of the sensors may be optimized.

Although illustrative embodiments of the present disclosure have been described by way of example for illustrative purposes, those of ordinary skill in the pertinent art will appreciate that various modifications and substitutions are possible without departing from the scope and spirit of the present disclosure. Accordingly, the scope of the inventive concept is not limited to the detailed description of this specification, but shall be defined as set forth in the accompanying claims.

What is claimed is:

1. A display device comprising:
a base layer; and
a pixel layer disposed on the base layer and including a plurality of reference pixel units and a plurality of photo-sensing elements,
wherein each of the plurality of reference pixel units includes a first light-emitting element, a second light-emitting element, and a third light-emitting element,
wherein each of the plurality of photo-sensing elements is interposed between two second light-emitting elements adjacent to each other in a first direction,
wherein at least one of the first light-emitting element or the third light-emitting element includes a plurality of sub-light-emitting elements electrically connected to each other,
wherein the third light-emitting element includes a plurality of third sub-light-emitting elements arranged in the first direction.

2. The display device of claim 1, wherein the plurality of third sub-light-emitting elements have substantially the same shape and size.

3. The display device of claim 1, wherein the plurality of third sub-light-emitting elements have mutually different shapes or sizes.

4. The display device of claim 3, wherein outermost light-emitting elements of the plurality of third sub-light-emitting elements, which are disposed at an outermost portion in the first direction, have a size smaller than a size of at least one central light-emitting element of the plurality of third sub-light-emitting elements.

5. The display device of claim 4,
wherein the outermost light-emitting elements have mutually different sizes in a substantially circular shape, and
wherein the central light-emitting element has a shape different from a shape of the outermost light-emitting elements.

6. The display device of claim 5, wherein the central light-emitting element has a substantially rectangular shape.

7. The display device of claim 1, wherein the first light-emitting element includes a plurality of first sub-light-emitting elements arranged in the first direction.

8. The display device of claim 7, wherein the number of the plurality of first sub-light-emitting elements is different from the number of the plurality of third-sub light-emitting elements.

9. The display device of claim 8,
wherein the second light-emitting element includes a plurality of second sub-light-emitting elements arranged in the first direction, and
wherein each of the second sub-light-emitting element has a substantially circular shape.

10. The display device of claim 1, wherein centers corresponding to the plurality of third sub-light-emitting elements are aligned in the first direction.

11. The display device of claim 1, wherein centers corresponding to the plurality of third sub-light-emitting elements are not aligned in the first direction.

12. The display device of claim 11, wherein the centers corresponding to the plurality of third sub-light-emitting elements are aligned in a fourth direction inclined with respect to the first direction.

13. The display device of claim 11, wherein the centers corresponding to the plurality of third sub-light-emitting elements are arranged in a zigzag pattern in the first direction.

14. The display device of claim 1,
wherein each reference pixel unit includes a first pixel including the first light-emitting element, each of two second pixels including the second light-emitting element, and a third pixel including the third light-emitting element, and
wherein at least one photo-sensing element of the plurality of photo-sensing elements is disposed in each reference pixel unit.

15. The display device of claim 1, wherein each of the plurality of photo-sensing elements has a shape different from a shape of the sub-light-emitting elements.

16. A display device comprising:
a base layer; and
a pixel layer disposed on the base layer and including a plurality of reference pixel units and a plurality of photo-sensing elements,
wherein each of the plurality of reference pixel units includes a first light emitting element, a second light emitting element, and a third light emitting element,
wherein at least one of the first light emitting element, the second light emitting element and the third light emitting element includes a plurality of sub-light emitting elements,
wherein one of the plurality of sub-light-emitting elements, which is closest to a respective one of the plurality of photo-sensing elements, has a substantially circular shape,
wherein outermost sub-light-emitting elements of the plurality of sub-light-emitting elements, which are disposed at an outermost portion in a first direction, have a shape or size different from a shape or size of at least one central sub-light-emitting element disposed between the outermost sub-light-emitting elements.

17. The display device of claim 16,
wherein the third light-emitting element t includes a plurality of third sub-light-emitting elements arranged in the first direction,
wherein centers of the plurality of third sub-light-emitting elements are aligned in the first direction.

18. The display device of claim 16, wherein the central sub-light-emitting element has a substantially rectangular shape.

19. The display device of claim 16, wherein the plurality of sub-light-emitting elements have mutually different shapes or sizes.

20. The display device of claim 16, wherein at least one photo-sensing element of the plurality of photo-sensing elements is disposed in each of the plurality of reference pixel units.

\* \* \* \* \*